US008084130B2

(12) United States Patent
Hamada et al.

(10) Patent No.: US 8,084,130 B2
(45) Date of Patent: Dec. 27, 2011

(54) EPOXY RESIN MOLDING MATERIAL FOR SEALING AND ELECTRONIC COMPONENT DEVICE

(75) Inventors: Mitsuyoshi Hamada, Abiko (JP); Akira Nagai, Hitachi (JP); Hiroaki Ikeba, Oyama (JP); Ken Nanaumi, Chikusei (JP); Kouhei Yasuzawa, Chikusei (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 48 days.

(21) Appl. No.: 12/444,026

(22) PCT Filed: Sep. 25, 2007

(86) PCT No.: PCT/JP2007/068559
§ 371 (c)(1),
(2), (4) Date: Apr. 2, 2009

(87) PCT Pub. No.: WO2008/041555
PCT Pub. Date: Apr. 10, 2008

(65) Prior Publication Data
US 2009/0326100 A1    Dec. 31, 2009

(30) Foreign Application Priority Data
Oct. 2, 2006 (JP) ................ P2006-270570

(51) Int. Cl.
*B32B 27/04* (2006.01)
*B32B 27/18* (2006.01)
*B32B 27/38* (2006.01)
*C08L 63/00* (2006.01)
*C08L 83/04* (2006.01)
*H01L 23/29* (2006.01)

(52) U.S. Cl. ........ 428/413; 257/788; 257/791; 257/793; 428/447; 525/476; 525/524; 525/525

(58) Field of Classification Search ................. 257/788, 257/791, 793; 428/413, 447; 525/474, 476, 525/477, 523, 524, 525, 526, 528
See application file for complete search history.

(56) References Cited

U.S. PATENT DOCUMENTS

| 5,194,556 | A | * | 3/1993 | Mueller et al. ................. 528/28 |
| 5,476,884 | A | * | 12/1995 | Kayaba et al. ................. 523/443 |
| 6,225,418 | B1 | * | 5/2001 | Satsu et al. ................. 525/524 |
| 6,821,657 | B1 | * | 11/2004 | Takahashi et al. ............ 428/414 |

FOREIGN PATENT DOCUMENTS

| JP | 06-224328 | 8/1994 |
| JP | 2005-015559 | 1/2005 |
| JP | 2005-015561 | 1/2005 |
| JP | 2005-015565 | 1/2005 |
| JP | 2005-036085 | 2/2005 |
| JP | 2005-281619 | 10/2005 |

OTHER PUBLICATIONS

Machine translation of JP 2005-015561 A, provided by the JPO website (no date).*
Machine translation of JP 2005-015565 A, provided by the JPO website (no date).*
Machine translation of JP 2005-036085 A, provided by the JPO website (no date).*
STN Registry Record of X-22-161A (no date).*
"Mounting Technology of Surface-Mounted LSI Package and Improvements in Its Reliability" edited by the Semiconductor and Integrated Circuit Division, Hitachi Ltd., Applied Technique Publishing Corporation (Ohyo Gizyutsu Shuppan according to transliteration), pp. 254-256, Nov. 16, 1988.
"High Reliability for Semiconductor Sealing Resin" edited by Technical Information Institute Co., Ltd., Technical Information Institute Co., Ltd., pp. 172-176, Jan. 31, 1990.
Chinese Official Action dated Nov. 9, 2010, for CN Application No. 200780036852.4.
Korean Official Action dated Feb. 21, 2011, for KR Application No. 10-2009-7008974.
Taiwanese Official Action dated Jul. 5, 2011, for TW Application No. 096136744.

* cited by examiner

*Primary Examiner* — Michael J Feely
(74) *Attorney, Agent, or Firm* — Antonelli, Terry, Stout & Kraus, LLP.

(57) ABSTRACT

The present invention provides an epoxy resin molding material for sealing that is excellent in fluidability and solder reflow resistance without lowering the curability thereof, and an electronic component device provided with an element sealed with the material. The epoxy resin molding material for sealing, comprising (A) an epoxy resin, (B) a curing agent, (C) a curing accelerating agent, (D) an inorganic filler, and (E) an alkoxysilane polymer, wherein the alkoxysilane polymer (E) is a polymer obtained by polymerizing an alkoxysilyl group moiety of a specific alkoxysilane compound.

14 Claims, No Drawings

EPOXY RESIN MOLDING MATERIAL FOR SEALING AND ELECTRONIC COMPONENT DEVICE

TECHNICAL FIELD

The present invention relates to an epoxy resin molding material for sealing, and an electronic component device provided with an element sealed with the same.

BACKGROUND ART

Hitherto, an epoxy resin molding material has widely been used in the technique of sealing electronic components such as transistors and ICs. This is because epoxy resin has a good balance between electrical characteristics, moisture resistance, heat resistance, mechanical characteristics, adhesiveness to an inserted product, and others. In the case of using, in particular, both of o-cresol Novolak type epoxy resin and a Novolak type phenol curing agent, the balance between these performances is excellent; thus, the resin has become the major current of base resin for molding-material for sealing.

As electronic instruments have been becoming smaller, lighter, and higher in performances in recent years, the packaging density thereof has been becoming higher. About electronic component devices, the package thereof has been changing from conventional pin-insert type packaging to surface mounting type packaging. In the case of mounting a semiconductor device onto a wiring board, pins are inserted into the wiring board and then the pins are soldered from the rear surface of the wiring board in conventional pin-insert type packaging. As a result, the package is not exposed directly to high temperature. However, in surface mounting type packaging, the total amount of a semiconductor device is treated with a solder bath or by means of a reflow device or the like; therefore, the device is exposed directly to soldering temperature. As a result, in a case where the package absorbs moisture, the absorbed water expands abruptly when the package is subjected to soldering. Thus, exfoliation is generated in the bonding interface or the package is cracked. For this reason, there is caused a problem that the reliability of the package is declined at the time of the packaging.

As a measure for solving the problem, adopted may be a method of carrying out damp-proof wrapping of ICs, or drying ICs sufficiently before the ICs are mounted onto a wiring board, and then using the dried ICs, or some other method (see, for example, pp. 254-256 of "Packaging Technique of Surface Mounting Type LSI Package, and Improvement in the Reliability thereof" edited by the Semiconductor and Integrated Circuit Division, Hitachi Ltd., Applied Technique Publishing Corporation (Ohyo Gizyutsu Shuppan according to transliteration), Nov. 16, 1988). However, these methods require labor and time, so that costs also increase. A different measure is a method of increasing the content of a filler in an epoxy resin molding material for sealing. According to this method, water absorbed in a semiconductor device can be decreased; however, the method has a problem that the fluidability of the epoxy resin molding material for sealing is decreased largely. As a method for increasing the content of a filler without deteriorating the fluidability of an epoxy resin molding material for sealing, suggested is a method of optimizing the particle diameter distribution of a filler (see Japanese Patent Application Laid-Open No. 06-224328). If the fluidability of epoxy resin molding material for sealing is low, there is also caused a new problem that gold wire sweep, voids, pinholes, and others are generated (see, for example, pp. 172-176 of "Improvement in Reliability of Semiconductor Sealing Resin" edited by Technical Information Institute Co., Ltd., Technical Information Institute Co., Ltd., Jan. 31, 1990).

As described above, if the fluidability of epoxy resin molding material for sealing is low, a new problem is also caused; thus, the fluidability of epoxy resin molding material for sealing has been desired to be improved without lowering the curability thereof. However, the above-mentioned method of optimizing the particle diameter distribution of a filler does not make it possible to improve the fluidability of epoxy resin molding material for sealing sufficiently.

An object of the invention is to provide an epoxy resin molding material for sealing that is excellent in fluidability and solder reflow resistance without lowering the curability thereof, and an electronic component device provided with an element sealed with the material.

DISCLOSURE OF THE INVENTION

The invention relates to (1) an epoxy resin molding material for sealing, comprising (A) an epoxy resin, (B) a curing agent, (C) a curing accelerating agent, (D) an inorganic filler, and (E) an alkoxysilane polymer, wherein the alkoxysilane polymer (E) is a polymer obtained by polymerizing an alkoxysilyl group moiety of an alkoxysilane compound represented by the following general formula (I), and the blending amount of the alkoxysilane polymer (E) is from 0.06 to 1.1% by mass of the total amount of the epoxy resin molding material for sealing:

[Chemical formula 1]

(I)

wherein $R^1$ represents any one of an —N=C=O group, a —SH group, an amino group, a hydrocarbon group containing a heterocycle which may have a substituent, and bonded organic groups between which a divalent or trivalent heteroatom which may have a substituent is interposed, $R^2$ represents a hydrocarbon group having 1 to 6 carbon atoms, $R^3$s each represent a methyl or an ethyl group, $R^4$ represents a hydrogen atom or a methyl group, and m represents 2 or 3.

The invention also relates to (2) the epoxy resin molding material for sealing according to item 1, wherein the weight-average molecular weight of the alkoxysilane polymer (E) is 3000 or less.

The invention also relates to (3) the epoxy resin molding material for sealing according to item 1 or 2, wherein $R^1$ in the general formula (I) is any one of an epoxy group, a methacryloyloxy group, an acryloyloxy group, an amino group, a mercapto group, and an isocyanate group.

The invention also relates to (4) the epoxy resin molding material for sealing according to any one of items 1 to 3, wherein the epoxy resin (A) is at least not less than one epoxy resin selected from the group consisting of biphenyl type epoxy resin, thiodiphenol type epoxy resin, Novolak type epoxy resin, naphthalene type epoxy resin, triphenylmethane type epoxy resin, bisphenol F type epoxy resin, phenol/aralkyl type epoxy resin, and naphthol/aralkyl type epoxy resin.

The invention also relates to (5) the epoxy resin molding material for sealing according to any one of items 1 to 4, wherein the curing agent (B) contains at least not less than one curing agent selected from the group consisting of phenol/aralkyl resin, naphthol/aralkyl resin, triphenylmethane type phenol resin, Novolak type phenol resin, and copolymerization type phenol/aralkyl resin.

The invention also relates to (6) the epoxy resin molding material for sealing according to any one of items 1 to 5, which comprises (F) a silane compound different from the alkoxysilane polymer (E).

The invention also relates to (7) an electronic component device, provided with an element sealed with an epoxy resin molding material for sealing as recited in any one of items 1 to 6.

According to the invention, it is possible to provide an epoxy resin molding material for sealing that is excellent in fluidability and solder reflow resistance without lowering the curability thereof, and an electronic component device provided with an element sealed with the material.

BEST MODE FOR CARRYING OUT THE INVENTION

The invention will be described in detail hereinafter.

The epoxy resin molding material of the invention for sealing contains (A) an epoxy resin, (B) a curing agent, (C) a curing accelerating agent, (D) an inorganic filler, and (E) an alkoxysilane polymer, wherein the alkoxysilane polymer (E) is a polymer obtained by polymerizing an alkoxysilyl group moiety of an alkoxysilane compound represented by the following general formula (I), and the blending amount of the alkoxysilane polymer (E) is from 0.06 to 1.1% by mass of the total amount of the epoxy resin molding material for sealing:

[Chemical formula 2]

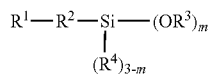

(I)

wherein $R^1$ represents any one of an —N═C═O group, a —SH group, an amino group, a hydrocarbon group containing a heterocycle which may have a substituent, and bonded organic groups between which a divalent or trivalent heteroatom which may have a substituent is interposed, $R^2$ represents a hydrocarbon group having 1 to 6 carbon atoms, $R^3$s each represent a methyl or an ethyl group, $R^4$ represents a hydrogen atom or a methyl group, and m represents 2 or 3.

(A) Epoxy Resin

The epoxy resin (A) used in the invention is not particularly limited as far as the resin is a resin having in a single molecule thereof two or more epoxy groups. Examples of the epoxy resin (A) include Novolak type epoxy resin yielded by epoxidizing a Novolak resin obtained by condensing or co-condensing a phenol compound such as phenol, cresol, xylenol, resorcin, catechol, bisphenol A or bisphenol F and/or a naphthol compound such as α-naphthol, β-naphthol or dihydroxynaphthalene, and a compound having an aldehyde group, such as formaldehyde, acetoaldehyde, propionaldehyde, benzaldehyde or salicylaldehyde in the presence of an acidic catalyst, typical examples of this Novolak type epoxy resin including phenol Novolak type epoxy resin, o-cresol Novolak type epoxy resin, and an epoxy resin having a triphenylmethane skeleton;

diglycidyl ethers such as bisphenol A, bisphenol F, bisphenol S, biphenol, and thiodiphenol which are substituted with an alkyl or an aromatic ring, or unsubstituted;

stylbene type epoxy resin;

hydroquinone type epoxy resin;

glycidyl ester type epoxy resin, which is obtained by reaction between a polybasic acid, such as phthalic acid or dimer acid, and epichlorohydrin;

glycidylamine type epoxy resin, which is obtained by reaction between a polyamine, such as diaminodiphenylmethane and isocyanuric acid, and epichlorohydrin;

an epoxidized product of a co-condensed resin made from dicyclopentadiene and a phenol;

epoxy resin having a naphthalene ring;

an epoxidized product of an aralkyl type phenol resin, such as phenol/aralkyl resin and/or naphthol/aralkyl resin synthesized from a phenol compound and/or a naphthol compound, and dimethoxy-p-xylene or bis(methoxymethyl)biphenyl;

trimethylolpropane type epoxy resin;

terpene-modified epoxy resin;

linear aliphatic epoxy resin, which is obtained by oxidizing olefin bonds with a peracid such as acetic peracid; and alicyclic epoxy resin. These may be used alone or in combination of two or more thereof.

The epoxy resin (A) used in the invention preferably contains biphenyl type epoxy resin, which is a diglycidyl ether of biphenol that is substituted with an alkyl or an aromatic ring, or unsubstituted, from the viewpoint of the compatibility between fluidability and curability. From the viewpoint of curability, the epoxy resin (A) preferably contains Novolak type epoxy resin. From the viewpoint of heat resistance and warp-smallness, the epoxy resin (A) preferably contains naphthalene type epoxy resin and/or triphenylmethane type epoxy resin. From the viewpoint of the compatibility between fluidability and flame retardancy, the epoxy resin (A) preferably contains bisphenol F type epoxy resin, which is a diglycidyl ether of bisphenol F that is substituted with an alkyl or an aromatic ring, or unsubstituted. From the viewpoint of the compatibility between fluidability and reflow property, the epoxy resin (A) preferably contains thiodiphenol type epoxy resin, which is a diglycidyl ether of thiodiphenol that is substituted with an alkyl or an aromatic ring, or unsubstituted. From the viewpoint of the compatibility between curability and flame retardancy, the epoxy resin (A) preferably contains an epoxy product of phenol/aralkyl resin synthesized from phenol that is substituted with an alkyl or an aromatic ring, or unsubstituted, and bis(methoxymethyl)biphenyl. From the viewpoint of the compatibility between storage stability and flame retardancy, the epoxy resin (A) preferably contains an epoxy product of naphthol/aralkyl resin synthesized from a naphthol compound that is substituted with an alkyl or an aromatic ring, or unsubstituted, and dimethoxy-p-xylene.

The biphenyl type epoxy resin is not particularly limited as far as the resin is an epoxy resin having a biphenyl skeleton. The resin is preferably an epoxy resin represented by the following general formula (II):

[Chemical formula 3]

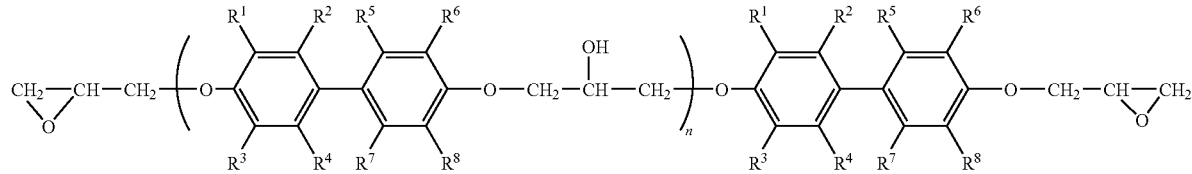

(II)

wherein $R^1(s)$ to $R^8(s)$ each represent a hydrogen atom, or a monovalent hydrocarbon group which has 1 to 10 carbon atoms and may have a substituent, and may be the same or different, and n represents an integer of 0 to 3.

The biphenyl type epoxy resin represented by the general formula (II) is yielded by causing a biphenol compound to react with epichlorohydrin by a know method. In the general formula (II), $R^1(s)$ to $R^8(s)$ are each a hydrogen, or a monovalent hydrocarbon group which has 1 to 10 carbon atoms and may have a substituent. Examples thereof include a hydrogen atom; alkyl groups having 1 to 10 carbon atoms, such as methyl, ethyl, propyl, butyl, isopropyl, isobutyl, and tert-butyl groups; and alkenyl groups having 1 to 10 carbon atoms, such as vinyl, allyl, and butenyl groups. Of these examples, a hydrogen atom or a methyl group is preferred. Such an epoxy resin is, for example, epoxy resin made mainly of 4,4'-bis(2,3-epoxypropoxy)biphenyl or 4,4'-bis(2,3-epoxypropoxy)-3,3',5,5'-tetramethylbiphenyl, or epoxy resin obtained by causing epichlorohydrin to react with 4,4'-biphenol or 4,4'-(3,3',5,5'-tetramethyl)biphenol. Particularly preferred is epoxy resin made mainly of 4,4'-bis(2,3-epoxypropoxy)-3,3',5,5'-tetramethylbiphenyl. About such an epoxy resin, YX-4000H and YL-6121H (trade names) manufactured by Japan Epoxy Resins Co., Ltd. are available as commercial products. The blending amount of the biphenyl type epoxy resin is preferably 20% or more, more preferably 30% or more by mass, particularly preferably 50% or more by mass of the total amount of the epoxy resin(s) in order to exhibit performances thereof.

The thiodiphenol type epoxy resin is, for example, an epoxy resin represented by the following general formula (III):

wherein $R^1(s)$ to $R^8(s)$ each represent a hydrogen atom, or a monovalent hydrocarbon group which has 1 to 10 carbon atoms and may have a substituent, and may be the same or different, and n represents an integer of 0 to 3.

The thiodiphenol type epoxy resin represented by the general formula (III) is yielded by causing a thiodiphenol compound to react with epichlorohydrin by a know method. In the general formula (III), $R^1(s)$ to $R^8(s)$ are each a hydrogen, or a monovalent hydrocarbon group which has 1 to 10 carbon atoms and may have a substituent. Examples thereof include a hydrogen atom; alkyl groups having 1 to 10 carbon atoms, such as methyl, ethyl, propyl, butyl, isopropyl, isobutyl, and tert-butyl groups; and alkenyl groups having 1 to 10 carbon atoms, such as vinyl, allyl, and butenyl groups. Of these examples, a hydrogen atom, a methyl group or a tert-butyl group is preferred. Such an epoxy resin is, for example, epoxy resin made mainly of diglycidyl ether of 4,4'-dihydroxy-diphenylsulfide, epoxy resin made mainly of diglycidyl ether of 2,2',5,5'-tetramethyl-4,4'-dihydroxydiphenylsulfide, or epoxy resin made mainly of diglycidyl ether of 2,2'-dimethyl-4,4'-dihydroxy-5,5'-di-tert-butyldiphenylsulfide. Particularly preferred is epoxy resin made mainly of diglycidyl ether of 2,2'-dimethyl-4,4'-dihydroxy-5,5'-di-tert-butyldiphenylsulfide. About such an epoxy resin, YSLV-120TE (trade name) manufactured by Nippon Steel Chemical Co., Ltd. is available as a commercial product. The blending amount of the thiodiphenol type epoxy resin is preferably 20% or more, more preferably 30% or more by mass, particularly preferably 50% or more by mass of the total amount of the epoxy resin(s) in order to exhibit performances thereof.

[Chemical formula 4]

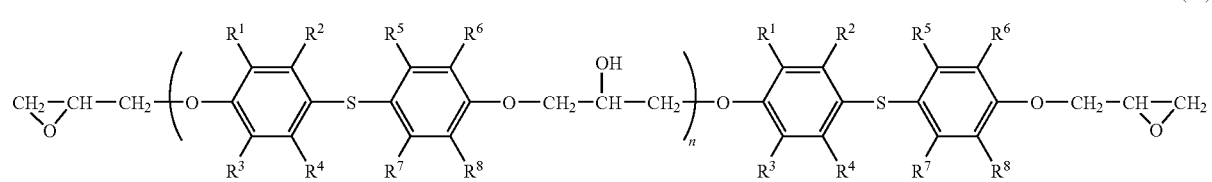

(III)

The bisphenol F type epoxy resin is, for example, an epoxy resin represented by the following general formula (IV):

[Chemical formula 5]

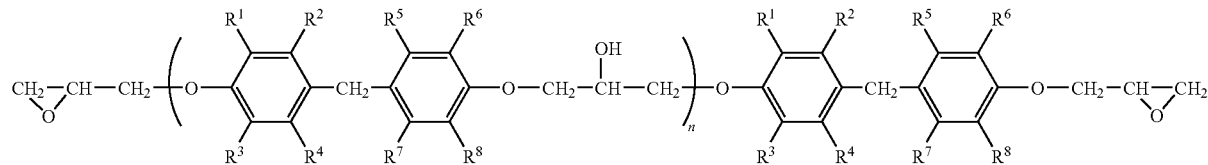

(IV)

wherein $R^1$(s) to $R^8$(s) each represent a hydrogen atom, or a monovalent hydrocarbon group which has 1 to 10 carbon atoms and may have a substituent, and may be the same or different, and n represents an integer of 0 to 3.

The bisphenol F type epoxy resin represented by the general formula (IV) is yielded by causing a bisphenol F compound to react with epichlorohydrin by a know method. In the general formula (IV), $R^1$(s) to $R^8$(s) are each a hydrogen, or a monovalent hydrocarbon group which has 1 to 10 carbon atoms and may have a substituent. Examples thereof include a hydrogen atom; alkyl groups having 1 to 10 carbon atoms, such as methyl, ethyl, propyl, butyl, isopropyl, isobutyl, and tert-butyl groups; and alkenyl groups having 1 to 10 carbon atoms, such as vinyl, allyl, and butenyl groups. Of these examples, a hydrogen atom or a methyl group is preferred. Such an epoxy resin is, for example, epoxy resin made mainly of diglycidyl ether of 4,4'-methylenebis(2,6-dimethylphenol), epoxy resin made mainly of diglycidyl ether of 4,4'-methylenebis(2,3,6-trimethylphenol), or epoxy resin made mainly of diglycidyl ether of 4,4'-methylenebisphenol. Particularly preferred is epoxy resin made mainly of diglycidyl ether of 4,4'-methylenebis(2,6-dimethylphenol). About such an epoxy resin, YSLV-80XY (trade name) manufactured by Nippon Steel Chemical Co., Ltd. is available as a commercial product. The blending amount of the bisphenol F type epoxy resin is preferably 20% or more, more preferably 30% or more by mass, particularly preferably 50% or more by mass of the total amount of the epoxy resin(s) in order to exhibit performances thereof.

The Novolak type epoxy resin is not particularly limited as far as the resin is an epoxy resin obtained by epoxidizing a Novolak type phenol resin. The resin is, for example, an epoxy resin represented by the following general formula (V):

[Chemical formula 6]

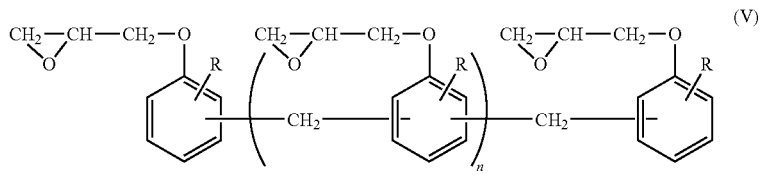

(V)

wherein Rs each represent a hydrogen atom, or a monovalent hydrocarbon group which has 1 to 10 carbon atoms and may have a substituent, and n represents an integer of 0 to 10.

The Novolak type epoxy resin represented by the general formula (V) is easily obtained by causing a Novolak type phenol resin to react with epichlorohydrin. In the general formula (V), Rs are each a hydrogen, or a monovalent hydrocarbon group which has 1 to 10 carbon atoms and may have a substituent. Preferred Examples thereof include a hydrogen atom; alkyl groups having 1 to 10 carbon atoms, such as methyl, ethyl, propyl, butyl, isopropyl, and isobutyl groups; and alkoxy groups having 1 to 10 carbon atoms, such as methoxy, ethoxy, propoxy, and butoxy groups. More preferred is a hydrogen atom or a methyl group. Preferably, n is an integer of 0 to 3. Of Novolak type epoxy resins represented by the general formula (V), preferred is o-cresol Novolak type epoxy resin. When the Novolak type epoxy resin is used, the blending amount thereof is preferably 20% or more, more preferably 30% or more by mass of the total amount of the epoxy resin(s) in order to exhibit performances thereof.

The naphthalene type epoxy resin is, for example, an epoxy resin represented by the following general formula (VI):

[Chemical formula 7]

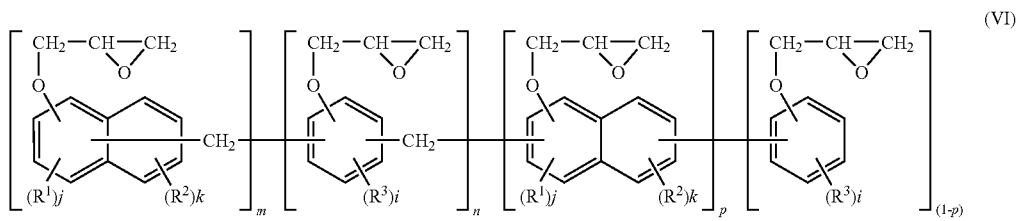

(VI)

wherein $R^1(s)$ to $R^3(s)$ each represent a hydrogen atom, or a monovalent hydrocarbon group which has 1 to 12 carbon atoms and may have a substituent, and may be the same or different; p is 1 or 0; m and n are each an integer of 0 to 11; p, m and n are selected to set (m+n) to an integer of 1 to 11 and set to (m+p) to an integer of 1 to 12; i represents an integer of 0 to 3; j represents an integer of 0 to 2; and k represent an integer of 0 to 4.

The naphthalene type epoxy resin represented by the general formula (VI) may be a random copolymer wherein constituting units the number of which is m and those the number of which is n are contained at random, an alternating copolymer wherein they are alternately contained, a copolymer wherein they are regularly contained, and a block copolymer wherein they are contained in the form of blocks. These may be used alone or in combination of two or more thereof.

The triphenylmethane type epoxy resin is, for example, an epoxy represented by the following general formula (VII):

[Chemical formula 8]

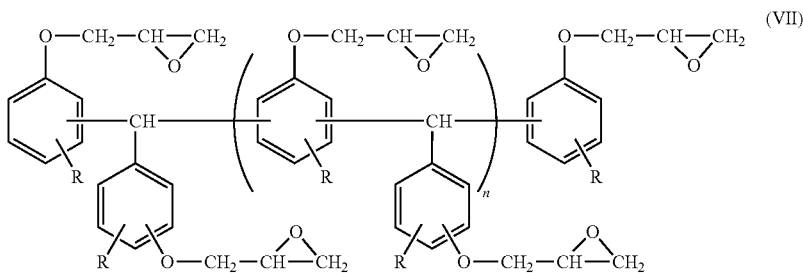

(VII)

wherein Rs each represent a hydrogen atom, or a monovalent hydrocarbon group which has 1 to 10 and may have a substituent, and n represents an integer of 1 to 10.

The triphenylmethane type epoxy resin represented by the general formula (VII) is not particularly limited, and is preferably salicylaldehyde type epoxy resin.

The naphthalene type epoxy resin and the triphenylmethane type epoxy resin may be used alone or in combination of the two. About the blending amount thereof, the total amount of the combination is preferably 20% or more, more preferably 30% or more by mass, particularly preferably 50% or more by mass of the total amount of the epoxy resins in order to exhibit performances thereof.

The epoxidized product of phenol/aralkyl resin is, for example, an epoxy resin represented by the following general formula (VIII):

[Chemical formula 9]

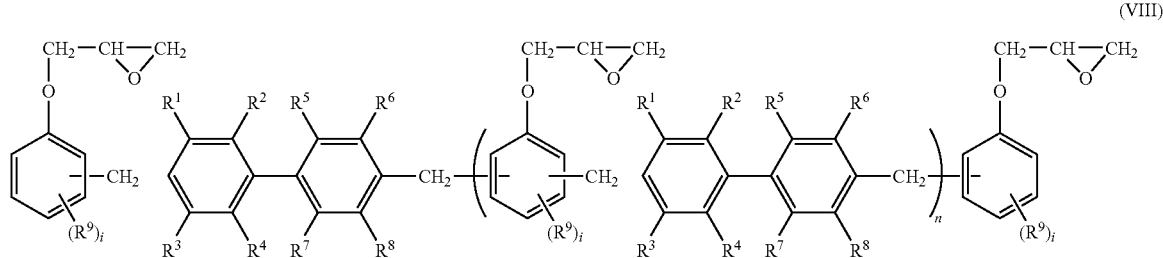

(VIII)

wherein $R^1$(s) to $R^9$(s) each represent a hydrogen atom, or a monovalent hydrocarbon group which has 1 to 12 carbon atoms and may have a substituent, and may be the same or different, i represents 0 or an integer of 1 to 3, and n represents 0 or an integer of 1 to 10.

The epoxidized product of the biphenylene-skeleton-containing phenol/aralkyl resin represented by the general formula (VIII) is obtained by causing epichlorohydrin to react with a phenol/aralkyl resin synthesized from phenol that is substituted with an alkyl or an aromatic ring, or unsubstituted and bis(methoxymethyl)biphenyl by a known method. In the general formula (VIII), $R^1$(s) to $R^9$(s) are each a hydrogen atom, or a monovalent hydrocarbon group which has 1 to 12 carbon atoms and may have a substituent. Examples thereof include a hydrogen atom; chain alkyl groups such as methyl, ethyl, propyl, isopropyl, n-butyl, sec-butyl, tert-butyl, pentyl, hexyl, octyl, decyl and dodecyl groups; cyclic alkyl groups such as cyclopentyl, cyclohexyl, cycloheptyl, cyclopentenyl and cyclohexenyl groups; aryl-group-substituted alkyl groups such as benzyl and phenethyl groups; alkoxy-group-substituted alkyl groups such as methoxy-group-substituted alky, ethoxy-group-substituted alkyl and butoxy-group-substituted alkyl groups; amino-group-substituted alkyl groups such as aminoalkyl, dimethylaminoalkyl and diethylaminoalkyl groups; hydroxyl-group-substituted alkyl groups;

It is preferred to use the epoxidized product of the biphenylene-skeleton-containing phenol/aralkyl resin represented by the general formula (VIII) in combination with a biphenyl type epoxy resin represented by the general formula (II) from the viewpoint of the compatibility between flame retardancy, reflow resistance and fluidability. Of these, it is more preferred to use the epoxidized product of the biphenylene-skeleton-containing phenol/aralkyl resin wherein $R^1$(s) to $R^8$(s) in the general formula (VIII) are each a hydrogen in combination with a biphenyl type epoxy resin wherein $R^1$ to $R^8$ in the general formula (II) are each a hydrogen and n is 0. When they are used in combination, the blending ratio (by mass part) is as follows: the ratio of the biphenyl type epoxy resin represented by the general formula (II) to the biphenylene-skeleton-containing phenol/aralkyl resin represented by the general formula (VIII) is preferably from 50/50 to 5/95, more preferably from 40/60 to 10/90, particularly preferably from 30/70 to 15/85. About a compound satisfying such a blending ratio, CER-3000L (trade name) manufactured by Nippon Kayaku Co., Ltd., and others are available as commercial products.

The epoxidized product of naphthol/aralkyl resin is, for example, an epoxy resin represented by the following general formula (IX):

[Chemical formula 10]

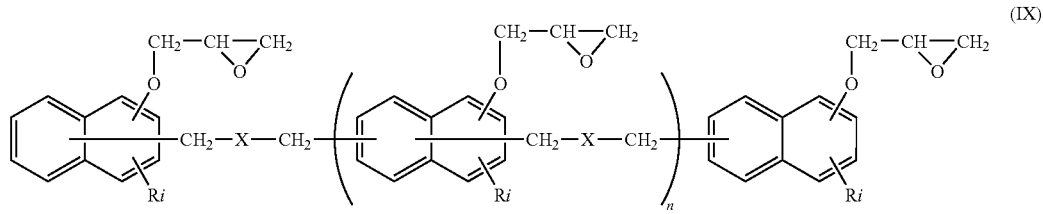

(IX)

unsubstituted aryl groups such as phenyl, naphthyl and biphenyl groups; alkyl-group-substituted aryl groups such as tolyl, dimethylphenyl, ethylphenyl, butylphenyl, tert-butylphenyl and dimethylnaphthyl groups; alkoxy-group-substituted aryl groups such as methoxyphenyl, ethoxyphenyl, butoxyphenyl, tert-butoxyphenyl and methoxynaphthyl groups; amino-group-substituted aryl groups such as dimethylamino-group-substituted aryl and diethylamino-group-substituted aryl groups; and hydroxyl-group-substituted aryl groups. Of these examples, a hydrogen atom or a methyl group is preferred. In the general formula (VIII), n is more preferably 6 or less on average. About such an epoxy resin, NC-3000S (trade name) manufactured by Nippon Kayaku Co., Ltd. is available as a commercial product.

wherein R(s) (each) represent(s) a hydrogen atom, or a monovalent hydrocarbon group which has 1 to 12 carbon atoms and may have a substituent, and may be the same or different; X(s) (each) represent(s) a divalent organic group containing an aromatic ring; i represents an integer of 0 to 3; and n represents an integer of 0 to 10.

In the general formula (IX), X(s) is/are (each) a divalent organic group containing an aromatic ring. Examples thereof include arylene groups such as phenylene, biphenylene and naphthylene groups; alkyl-group-substituted arylene groups such as a tolylene group; alkoxy-group-substituted arylene groups; aralkyl-group-substituted arylene groups; divalent groups each obtained from an aralkyl group such as a benzyl or phenethyl group; and divalent groups each containing an arylene group, such as a xylylene group. Of these examples, phenylene and biphenylene groups are preferred from the viewpoint of the compatibility between flame retardancy and storage stability.

The epoxidized product of the naphthol/aralkyl resin represented by the general formula (IX) is obtained by causing epichlorohydrin to react with a naphthol/aralkyl resin synthesized from naphthol that is substituted with an alkyl or an aromatic ring, or unsubstituted and dimethoxy-p-xylene or bis(methoxymethyl)biphenyl by a known method. In the general formula (IX), R(s) is/are (each) a hydrogen atom, or a monovalent hydrocarbon group which has 1 to 12 carbon atoms and may have a substituent. Examples thereof include a hydrogen atom; chain alkyl groups such as methyl, ethyl, propyl, isopropyl, n-butyl, sec-butyl, tert-butyl, pentyl, hexyl, octyl, decyl and dodecyl groups; cyclic alkyl groups such as cyclopentyl, cyclohexyl, cycloheptyl, cyclopentenyl and cyclohexenyl groups; aryl-group-substituted alkyl groups such as benzyl and phenethyl groups; alkoxy-group-substituted alkyl groups such as methoxy-group-substituted alky, ethoxy-group-substituted alkyl and butoxy-group-substituted alkyl groups; amino-group-substituted alkyl groups such as aminoalkyl, dimethylaminoalkyl and diethylaminoalkyl groups; hydroxyl-group-substituted alkyl groups; unsubstituted aryl groups such as phenyl, naphthyl and biphenyl groups; alkyl-group-substituted aryl groups such as tolyl, dimethylphenyl, ethylphenyl, butylphenyl, tert-butylphenyl and dimethylnaphthyl groups; alkoxy-group-substituted aryl groups such as methoxyphenyl, ethoxyphenyl, butoxyphenyl, tert-butoxyphenyl and methoxynaphthyl groups; amino-group-substituted aryl groups such as dimethylamino-croup-substituted aryl and diethylamino-group-substituted aryl groups; and hydroxyl-group-substituted aryl groups. Of these examples, a hydrogen atom or a methyl group is preferred. Such a naphthol/aralkyl resin epoxidized product is, for example, an epoxidized product of a naphthol/aralkyl resin represented by a general formula (X) or (XI) illustrated below. In the general formula (X) or (XI), n represents an integer of 0 to 10, and is preferably 6 or less on average. About the naphthol/aralkyl resin epoxidized product represented by the general formula (X), ESN-375 (trade name) manufactured by Nippon Steel Chemical Co., Ltd. is available as a commercial product. About the naphthol/aralkyl resin epoxidized product represented by the general formula (XI), ESN-175 (trade name) manufactured by Nippon Steel Chemical Co., Ltd. is available as a commercial product.

The blending amount of the naphthol/aralkyl resin epoxidized product is preferably 20% or more, more preferably 30% or more by mass, particularly preferably 50% or more by mass of the total amount of the epoxy resin(s) in order to exhibit performances thereof.

[Chemical formula 11]

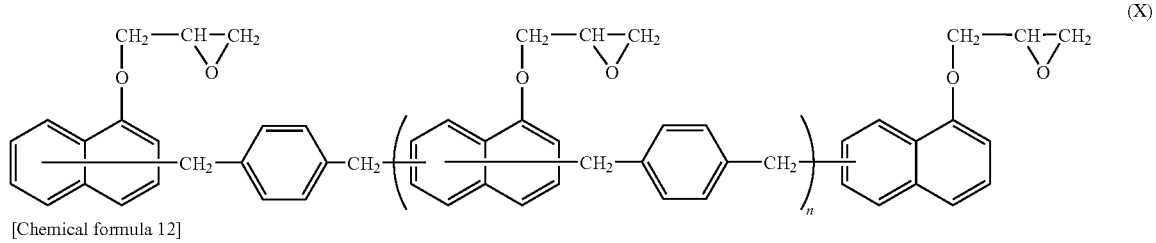

(X)

[Chemical formula 12]

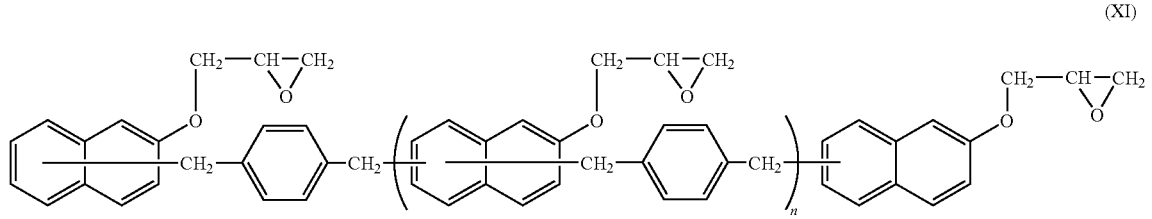

(XI)

The above-mentioned biphenyl type epoxy resin, thiodiphenol type epoxy resin, bisphenol F type epoxy resin, Novolak type epoxy resin, naphthalene type epoxy resin, triphenylmethane type epoxy resin, phenol/aralkyl resin epoxidized product and naphthol/aralkyl resin epoxidized product may be used alone or in combination of two or more thereof. About the blending amount when they are used in combination of two or more thereof, the total amount of the combination is preferably 50% or more, more preferably 60% or more by mass, particularly preferably 80% or more by mass of the total amount of the epoxy resins.

(B) Curing Agent

The curing agent (B) used in the invention is not particularly limited as far as the agent is a curing agent that is generally used in epoxy resin molding material for sealing. Examples thereof include Novolak type phenol resin yielded by condensing or co-condensing a phenol compound such as phenol, cresol, resorcin, catechol, bisphenol A, bisphenol F, phenylphenol, thiodiphenol or aminophenol and/or a naphthol compound such as α-naphthol, β-naphthol or dihydroxynaphthalene, and a compound having an aldehyde group, such as formaldehyde, benzaldehyde or salicylaldehyde in the presence of an acidic catalyst, aralkyl type phenol resin, such as phenol/aralkyl resin or naphthol/aralkyl resin synthesized from a phenol compound and/or a naphthol compound and dimethoxy-p-xylene or bis(methoxymethyl)biphenyl;

copolymerization type phenol/aralkyl resin wherein phenol Novolak structures and phenol/aralkyl structures are repeated at random, in the form of blocks, or in an alternate manner;

p-xylylene and/or m-xylylene modified phenol resin;
melamine modified phenol resin;
terpene-modified phenol resin;
dicyclopentadiene modified phenol resin;
cyclopentadiene modified phenol resin;

polycyclic aromatic ring modified phenol resin; and triphenylmethane type phenol resin. These may be used alone or in combination of two or more thereof.

Of these examples, phenol/aralkyl resin, copolymerization type phenol/aralkyl resin, and naphthol/aralkyl resin are preferred from the viewpoint of fluidability, flame retardancy and reflow resistance. Triphenylmethane type phenol resin is preferred from the viewpoint of heat resistance, a low expansion coefficient, and warp-smallness. Novolak type phenol resin is preferred from the viewpoint of curability. It is also preferred that the curing agent (B) in the invention contains at least one of these phenol resins.

The phenol/aralkyl resin is, for example, a resin represented by the following general formula (XII):

[Chemical formula 13]

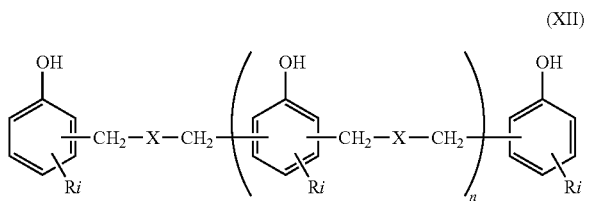

wherein R(s) (each) represent(s) a hydrogen atom, or a monovalent hydrocarbon group which has 1 to 12 carbon atoms and may have a substituent, and may be the same or different; X(s) (each) represent(s) a divalent organic group containing an aromatic ring; i represents an integer of 0 to 3; and n represents an integer of 0 to 10.

In the general formula (XII), R(s) is/are (each) a hydrogen atom, or a monovalent hydrocarbon group which has 1 to 12 carbon atoms and may have a substituent. Examples thereof include a hydrogen atom; chain alkyl groups such as methyl, ethyl, propyl, isopropyl, n-butyl, sec-butyl, tert-butyl, pentyl, hexyl, octyl, decyl and dodecyl groups; cyclic alkyl groups such as cyclopentyl, cyclohexyl, cycloheptyl, cyclopentenyl and cyclohexenyl groups; aryl-group-substituted alkyl groups such as benzyl and phenethyl groups; alkoxy-group-substituted alkyl groups such as methoxy-group-substituted alky, ethoxy-group-substituted alkyl and butoxy-group-substituted alkyl groups; amino-group-substituted alkyl groups such as aminoalkyl, dimethylaminoalkyl and diethylaminoalkyl groups; hydroxyl-group-substituted alkyl groups; unsubstituted aryl groups such as phenyl, naphthyl and biphenyl groups; alkyl-group-substituted aryl groups such as tolyl, dimethylphenyl, ethylphenyl, butylphenyl, tert-butylphenyl and dimethylnaphthyl groups; alkoxy-group-substituted aryl groups such as methoxyphenyl, ethoxyphenyl, butoxyphenyl, tert-butoxyphenyl and methoxynaphthyl groups; amino-group-substituted aryl groups such as dimethylamino-group-substituted aryl and diethylamino-group-substituted aryld groups; and hydroxyl-group-substituted aryl groups. Of these examples, a hydrogen atom or a methyl group is preferred.

X(s) is/are (each) a divalent organic group containing an aromatic ring. Examples thereof include arylene groups such as phenylene, biphenylene and naphthylene groups; alkyl-group-substituted arylene groups such as a tolylene group; alkoxy-group-substituted arylene groups; divalent groups each obtained from an aralkyl group such as a benzyl or phenethyl group; aralkyl-group-substituted arylene groups; and divalent groups each containing an arylene group, such as a xylylene group. Of these examples, a substituted or unsubstituted biphenylene group is preferred from the viewpoint of the compatibility between flame retardancy and reflow resistance; for example, a phenol/aralkyl resin represented by a general formula (XIII) illustrated below is preferred. From the viewpoint of the compatibility between flame retardancy, fluidability and curability, a substituted or unsubstituted phenylene group is preferred; for example, a phenol/aralkyl resin represented by a general formula (XIV) illustrated below is given. In the general formula (XIII) or the general formula (XIV), n represents an integer of 0 to 10 and is preferably 6 or less on average.

[Chemical formula 14]

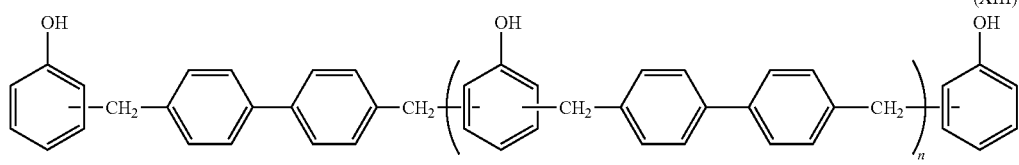

[Chemical formula 15]

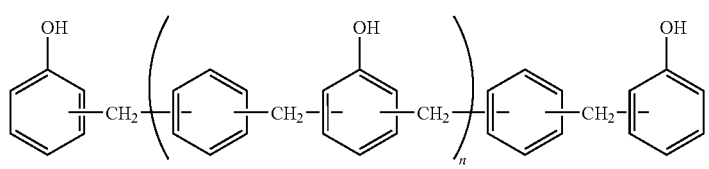

About the phenol/aralkyl resin represented by the general formula (XIII), MEH-7851 (trade name) manufactured by Meiwa Plastic Industries, Ltd. is available as a commercial product. About the phenol/aralkyl resin represented by the general formula (XIV), XLC (trade name) manufactured by Mitsui Chemicals, Inc. is available as a commercial product.

The blending amount of the phenol/aralkyl resin is preferably 20% or more, more preferably 30% or more by mass, particularly preferably 50% or more by mass of the total amount of the curing agent(s) in order to exhibit performances thereof.

The naphthol/aralkyl resin is, for example, a resin represented by the following general formula (XV):

[Chemical formula 16]

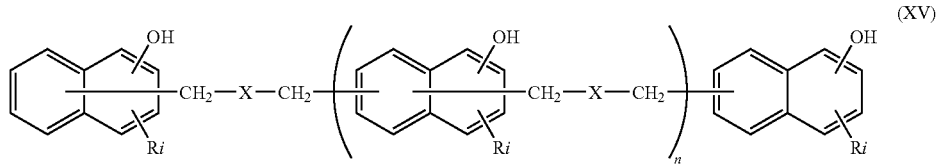

R(s) (each) represent(s) a hydrogen atom, or a monovalent hydrocarbon group which has 1 to 12 carbon atoms and may have a substituent, and may be the same or different; X(s) (each) represent(s) a divalent organic group containing an aromatic ring; i represents an integer of 0 to 3; and n represents an integer of 0 to 10.

In the general formula (XV), R(s) is/are (each) a hydrogen atom, or a monovalent hydrocarbon group which has 1 to 12 carbon atoms and may have a substituent. Examples thereof include a hydrogen atom; chain alkyl groups such as methyl, ethyl, propyl, isopropyl, n-butyl, sec-butyl, tert-butyl, pentyl, hexyl, octyl, decyl and dodecyl groups; cyclic alkyl groups such as cyclopentyl, cyclohexyl, cycloheptyl, cyclopentenyl and cyclohexenyl groups; aryl-group-substituted alkyl groups such as benzyl and phenethyl groups; alkoxy-group-substituted alkyl groups such as methoxy-group-substituted alky, ethoxy-group-substituted alkyl and butoxy-group-substituted alkyl groups; amino-group-substituted alkyl groups such as aminoalkyl, dimethylaminoalkyl and diethylaminoalkyl groups; hydroxyl-group-substituted alkyl groups; unsubstituted aryl groups such as phenyl, naphthyl and biphenyl groups; alkyl-group-substituted aryl groups such as tolyl, dimethylphenyl, ethylphenyl, butylphenyl, tert-butylphenyl and dimethylnaphthyl groups; alkoxy-group-substituted aryl groups such as methoxyphenyl, ethoxyphenyl, butoxyphenyl, tert-butoxyphenyl and methoxynaphthyl groups; amino-group-substituted aryl groups such as dimethylamino-qroup-substituted aryl and diethylamino-group-substituted aryl groups; and hydroxyl-group-substituted aryl groups. Of these examples, a hydrogen atom or a methyl group is preferred.

X(s) is/are (each) a divalent organic group containing an aromatic ring. Examples thereof include arylene groups such as phenylene, biphenylene and naphthylene groups; alkyl-group-substituted arylene groups such as a tolylene group; alkoxy-group-substituted arylene groups; aralkyl-group-substituted arylene groups; divalent groups each obtained from an aralkyl group such as a benzyl or phenethyl group; and divalent groups each containing an arylene group, such as a xylylene group. Of these examples, a substituted or unsubstituted phenylene and biphenylene groups are preferred, and a phenylene group is more preferred from the viewpoint of storage stability and flame retardancy; for example, naphthol/aralkyl resins represented by general formulae (XVI) and (XVII) illustrated below are given. In the general formulae (XVI) and (XVII), n represents 0 or an integer of 1 to 10, and is preferably 6 or less on average.

[Chemical formula 17]

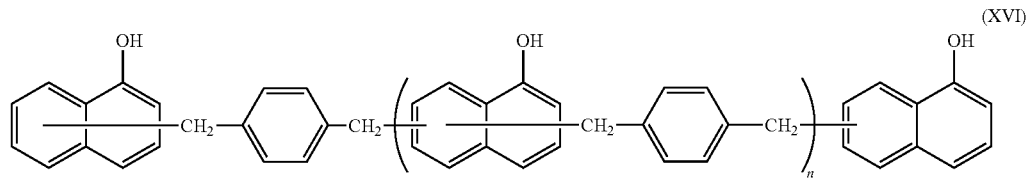

[Chemical formula 18]

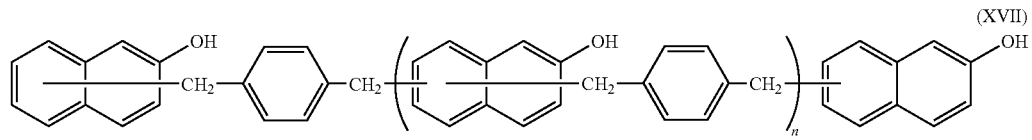

About the naphthol/aralkyl resin represented by the general formula (XVI), SN-475 (trade name) manufactured by Nippon Steel Chemical Co., Ltd. is available as a commercial product. About the naphthol/aralkyl resin represented by the general formula (XVII), SN-170 (trade name) manufactured by Nippon Steel Chemical Co., Ltd. is available as a commercial product. The blending amount of the above-mentioned naphthol/aralkyl resin is preferably 20% or more, more preferably 30% or more by mass, particularly preferably 50% or more by mass of the total amount of the curing agent(s) in order to exhibit performances thereof.

It is also preferred from the viewpoint of flame retardancy that the phenol/aralkyl resin represented by the general formula (XII) or the naphthol/aralkyl resin represented by the general formula (XV) is partially or totally pre-mixed with acenaphthylene. Acenaphthylene can be obtained by dehydrogenating acenaphthene; acenaphthylene may be used as a commercial product thereof. It is allowable to use a polymer of acenaphthylene or a copolymer made from acenaphthylene and a different aromatic olefin. The method for yielding the polymer of acenaphthylene or the copolymer made from acenaphthylene and a different aromatic olefin may be a method using radical polymerization, cation polymerization, anion polymerization or the like. At the time of the polymerization, a catalyst known in the prior art may be used. The polymerization may be conducted only by heating without using any catalyst. At this time, the polymerization temperature is preferably from 80° C. to 160° C., more preferably from 90° C. to 150° C. The softening point of the resultant polymer of acenaphthylene or copolymer made from acenaphthylene and a different aromatic olefin is preferably from 60° C. to 150° C., more preferably from 70° C. to 130° C. If the softening point is lower than 60° C., at the time of molding the molding material the moldability tends to lower by exudation thereof. If the softening point is higher than 150° C., the compatibility with epoxy resin tends to lower. Examples of the different aromatic olefin to be copolymerized with acenaphthylene include styrene, α-methylstyrene, indene, benzothiophene, benzofuran, vinylnaphthalene, vinylbiphenyl, and alkyl-substituted products thereof. Besides the aromatic olefin, an aliphatic olefin may be used together as far as the advantageous effects of the invention are not deteriorated. Examples of the aliphatic olefin include (meth)acrylic acid and esters thereof; and maleic anhydride, itaconic anhydride, fumaric acid, and esters thereof. The use amount of the aliphatic olefin is preferably 20% or less by mass, more preferably 9% or less by mass of the total amount of the polymerizing monomers.

Examples of the method for pre-mixing the phenol/aralkyl resin represented by the general formula (XII) or the naphthol/aralkyl resin represented by the general formula (XV) partially or totally with acenaphthylene include: a method of pulverizing the phenol/aralkyl resin and acenaphthylene into fine particles, and mixing the particles with a mixer or the like in the state that the particles are kept in a solid state; a method of dissolving the phenol/aralkyl resin and acenaphthylene uniformly into a solvent, and then removing the solvent; and a method of melt-mixing the two at a temperature not lower than the softening point(s) of the phenol/aralkyl resin and/or acenaphthylene. The melt-mixing method is preferred since a uniform mixture is yielded and impurities are less incorporated therein. The pre-mixture (the phenol/aralkyl resin modified with acenaphthylene) is produced by any one of these methods. The melt-mixing is not particularly limited as far as the melt-mixing is conducted at a temperature not lower than the softening point(s) of the phenol/aralkyl resin and/or acenaphthylene. The temperature is preferably from 100° C. to 250° C., more preferably from 120° C. to 200° C. The melt-mixing is not particularly limited in mixing time as far as the phenol/aralkyl resin and acenaphthylene are uniformly mixed. The time is preferably from 1 to 20 hours, more preferably from 2 to 15 hours. When the phenol/aralkyl resin and acenaphthylene are pre-mixed, acenaphthylene may be polymerized or react with the phenol/aralkyl resin in the mixing.

The triphenylmethane type phenol resin is, for example, a phenol compound resin represented by the following general formula (XVIII):

[Chemical formula 19]

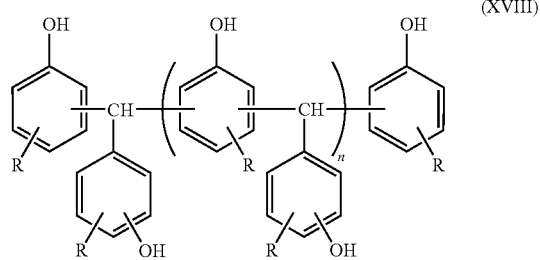

(XVIII)

wherein Rs each represent a hydrogen atom, or a monovalent hydrocarbon group which has 1 to 10 carbon atoms and may have a substituent, and n represents an integer of 0 to 10.

In the general formula (XVIII), Rs are each a hydrogen atom, or a monovalent hydrocarbon group which has 1 to 10 carbon atoms and may have a substituent. Examples thereof include a hydrogen atom; alkyl groups such as methyl, ethyl, propyl, butyl, isopropyl and tert-butyl groups; alkenyl groups such as vinyl, allyl and butenyl groups; halogenated alkyl groups; amino-group-substituted alkyl groups; and mercapto-group-substituted alkyl groups. Of these examples, preferred are alkyl groups such as methyl and ethyl groups, and a hydrogen atom. More preferred are a methyl group and a hydrogen atom. The blending amount of the triphenylmethane type phenol resin is preferably 30% or more, more preferably 50% or more by mass of the total amount of the curing agent(s) in order to exhibit performances thereof.

Examples of the Novolak type phenol resin include: a phenol compound resin represented by a general formula (XIX) illustrated below and other Novolak type phenol resins; and cresol Novolak resins. Of the examples, a Novolak type phenol compound resin represented by the general formula (XIX) is preferred.

[Chemical formula 20]

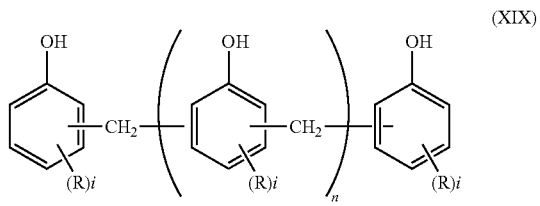

(XIX)

wherein R(s) (each) represent(s) a hydrogen atom, or a monovalent hydrocarbon group which has 1 to 10 carbon atoms and may have a substituent, i represents an integer of 0 to 3, and n represents an integer of 0 to 10.

In the general formula (XIX), R(s) is/are (each) a hydrogen atom, or a monovalent hydrocarbon group which has 1 to 10 carbon atoms and may have a substituent. Examples thereof include a hydrogen atom; alkyl groups such as methyl, ethyl, propyl, butyl, isopropyl and tert-butyl groups; alkenyl groups such as vinyl, allyl and butenyl groups; halogenated alkyl groups; amino-group-substituted alkyl groups; and mercapto-group-substituted alkyl groups. Of these examples, alkyl groups such as methyl and ethyl groups, and a hydrogen atom are preferred, and a hydrogen atom is more preferred. The average value of n is preferably from 0 to 8. The blending amount of the Novolak type phenol resin is preferably 30% or more, more preferably 50% or more by mass of the total amount of the curing agent(s) in order to exhibit performances thereof.

The copolymerization type phenol/aralkyl resin is, for example, a phenol resin represented by the following general formula (XX):

[Chemical formula 21]

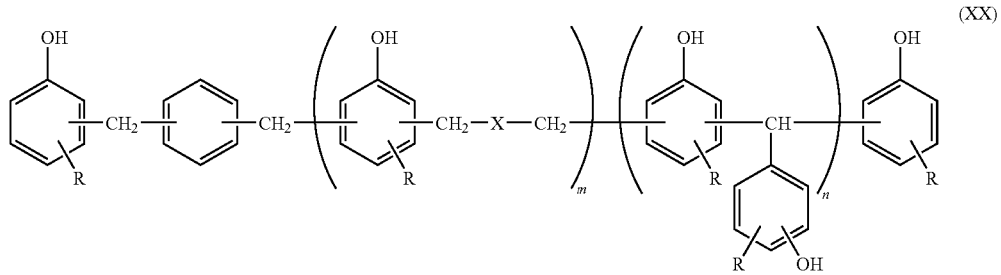

wherein Rs are each selected from a hydrogen atom, monovalent hydrocarbon groups which have 1 to 12 carbon atoms and may have a substituent, and a hydroxyl group, Rs may be the same or different, X(s) (each) represent(s) a divalent group containing an aromatic ring, and n and m each represent 0 or an integer of 1 to 10.

In the general formula (XX), Rs are each a hydrogen atom, a monovalent hydrocarbon group which has 1 to 12 carbon atoms and may have a substituent, or a hydroxyl group. Examples thereof include a hydrogen atom; chain alkyl groups such as methyl, ethyl, propyl, isopropyl, n-butyl, sec-butyl, tert-butyl, pentyl, hexyl, octyl, decyl and dodecyl groups; cyclic alkyl groups such as cyclopentyl, cyclohexyl, cycloheptyl, cyclopentenyl and cyclohexenyl groups; aryl-group-substituted alkyl groups such as benzyl and phenethyl groups; alkoxy-group-substituted alkyl groups such as methoxy-group-substituted alky, ethoxy-group-substituted alkyl and butoxy-group-substituted alkyl groups; amino-group-substituted alkyl groups such as aminoalkyl, dimethylaminoalkyl and diethylaminoalkyl groups; hydroxyl-group-substituted alkyl groups; unsubstituted aryl groups such as phenyl, naphthyl and biphenyl groups; alkyl-group-substituted aryl groups such as tolyl, dimethylphenyl, ethyiphenyl, butylphenyl, tert-butylphenyl and dimethylnaphthyl groups; alkoxy-group-substituted aryl groups such as methoxyphenyl, ethoxyphenyl, butoxyphenyl, tert-butoxyphenyl and methoxynaphthyl groups; amino-group-substituted aryl groups such as dimethylamino-group-substituted aryl and diethylamino-group-substituted aryl groups; and hydroxyl-group-substituted aryl groups. Of these examples, a hydrogen atom or a methyl group is preferred. n and m each represent an integer of 0 to 10, and are each preferably 6 or less on average.

In the general formula (XX), X(s) is/are (each) a divalent group containing an aromatic ring, and examples thereof include arylene groups such as phenylene, biphenylene and naphthylene groups; alkyl-group-substituted arylene groups such as a tolylene group; alkoxy-group-substituted arylene groups; aralkyl-group-substituted arylene groups; divalent groups each obtained from an aralkyl group such as a benzyl or phenethyl group; and divalent groups each containing an arylene group, such as a xylylene group. Of these examples, substituted or unsubstituted phenylene and biphenylene groups are preferred from the viewpoint of storage stability and flame retardancy.

About the copolymerization type phenol/aralkyl resin represented by the general formula (XX), HE-510 (trade name) manufactured by Sumikin Air Water Chemical Inc. and others are available as commercial products. The blending amount of the copolymerization type phenol/aralkyl resin is preferably 30% or more, more preferably 50% or more by mass of the total amount of the curing agent(s) in order to exhibit performances thereof.

The phenol/aralkyl resin, naphthol/aralkyl resin, dicyclopentadiene type phenol resin, triphenylmethane type phenol resin, Novolak type phenol resin, and copolymerization type phenol/aralkyl resin may be used alone or in combination of two or more thereof. About the blending amount when two or more of the resins are used in combination, the total amount of the combination is preferably 50% or more, more preferably 60% or more, particularly preferably 80% or more by mass of the total amount of the phenol resins.

In the invention, the equivalent ratio between the epoxy resin (A) and the curing agent (B), that is, the ratio of the number of hydroxyl groups in the curing agent to the number of epoxy groups in the epoxy resin (the hydroxyl group number in the curing agent/the epoxy group number in the epoxy resin) is not particularly limited, and is preferably from 0.5 to 2, more preferably from 0.6 to 1.3 in order to control unreacted portion of each of the components into a small value. The equivalent ratio is more preferably from 0.8 to 1.2 in order to yield an epoxy resin molding material for sealing excellent in moldability and solder reflow resistance.

(C) Curing Accelerating Agent

The curing accelerating agent (C) used in the invention is not particularly limited as far as the agent is an agent used ordinarily in epoxy resin molding material for sealing. Examples thereof include cycloamidine compounds such as 1,8-diazabicyclo[5.4.0]undecene-7, 1,5-diazabicyclo[4.3.0]nonene-5, and 5,6-dibutylamino-1,8-diazabicyclo[5.4.0]undecene-7; intermolecular-polarity-having compounds obtained by adding, to these compounds, a compound having a π bond, such as maleic anhydride, a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4 benzoquinone, 2,3-dimethoxy-1,4-benzoquinone or phenyl-1,4-benzoquinone, diazophenylmethane, or phenol resin; tertiary amines such as benzyldimethylamine, triethanolamine, dimethylaminoethanol and tris(dimethylaminomethyl)phenol, and derivatives thereof; imidazoles such as 2-methylimidazole, 2-phenylimidazole, 2-phenyl-4-methylimidazole and 2-heptadecylimidazole, and derivatives thereof; organic phosphines such as tributylphosphine, methyldiphenylphosphine, triphenylphosphine, tris(4-methylphenyl)phosphine, diphenylphosphine and phenylphosphine; intermolecular-polarity-having phosphorus compounds obtained by adding, to these phosphines, a compound having a π bond, such as maleic anhydride, a quinone compound as described above, diazophenylmethane, or phenol resin; tetra-substituted phosphonium/tetra-substituted borates, such as tetraphenylphosphonium tetraphenylborate, tetraphenylphosphonium ethyltriphenylborate, and tetrabutylphosphonium tetrabutylborate; tetraphenylborates such as 2-ethyl-4-methylimidazole/tetraphenylborate and N-methylmorpholine/tetraphenylborate, and derivatives thereof. These curing accelerating agents may be used alone or in combination of two or more thereof.

Of these curing accelerating agents, adducts of a tertiary phosphine and a quinone compound are preferred from the viewpoint of curability and fluidability. From the viewpoint of storage stability, preferred are adducts of a cycloamidine compound and phenol resin, and more preferred are Novolak type phenol resin salts of diazabicycloundecene. About the blending amount of these curing accelerating agents, the total amount of the combination is preferably 60% or more by weight, more preferably 80% or more by mass of the total amount of the curing accelerating agents.

About the adducts of a tertiary phosphine and a quinone compound is not particularly limited, examples of the used tertiary phosphine include tertiary phosphines having an aryl group, such as dibutylphenylphosphine, butyldiphenylphosphine, ethyldiphenylphosphine, triphenylphosphine, tributylphosphine, tris(4-methylphenyl)phosphine, tris(4-ethylphenyl)phosphine, tris(4-propylphenyl)phosphine, tris(4-butylphenyl)phosphine, tris(isopropylphenyl)phosphine, tris (tert-butylphenyl)phosphine, tris(2,4-dimethylphenyl) phosphine, tris(2,6-dimethylphenyl)phosphine, tris(2,4,6-trimethylphenyl)phosphine, tris(2,6-dimethyl-4-methoxyphenyl)phosphine, tris(4-methoxyphenyl) phosphine, and tris(4-ethoxyphenyl)phosphine. From the viewpoint of moldability, triphenylphosphine is preferred.

About the adducts of a tertiary phosphine and a quinone compound, the used quinone compound is not particularly limited, and examples thereof include o-benzoquinone, p-benzoqinone, diphenoquinone, 1,4-naphthoquinone, and anthraquinone. From the viewpoint of moisture resistance or storage stability, p-benzoquinone is preferred.

The blending amount of the curing accelerating agent is not particularly limited as far as the amount permits curing-accelerating effect to be attained. The amount is preferably from 0.1 to 10 parts by mass, more preferably from 0.3 to 5 parts by mass with respect to 100 parts by mass of the total amount of the epoxy resin (A) and the curing agent (B). If the blending amount of the curing accelerating agent is less than 0.1 parts by mass, it is difficult to cause the molding material to be cured in a short time. If the amount is more than 10% by mass, the curing rate is too large so that a good molded body tends not to be obtained.

(D) Inorganic Filler

The inorganic filler (D) used in the invention is a substance to be incorporated into the epoxy resin molding material for sealing in order to decrease the moisture resistance and the linear expansion coefficient and improve the thermal conductivity and the strength, and is not particularly limited as far as the filler is an inorganic filler used ordinarily in epoxy resin molding material for sealing. Examples thereof include powder of fused silica, crystalline silica, alumina, zircon, calcium silicate, calcium carbonate, potassium titanate, silicon carbide, silicon nitride, aluminum nitride, boron nitride, beryllia, zirconia, zircon, forstelite, steatite, spinel, mullite or titania; beads obtained by making the powder into the form of spheres; and glass fiber. These species may be used alone or in combination of two or more. Of these examples, fused silica is preferred from the viewpoint of a decrease in the linear expansion coefficient, and alumina is preferred from the viewpoint of an improvement in the thermal conductivity. The shape of the inorganic filler is preferably spherical from the viewpoint of the fluidability and the mold abrasiveness of the epoxy resin molding material for sealing when the material is molded. Spherical fused silica is preferred, particularly, from the viewpoint of the balance between costs and performances.

The blending amount of the inorganic filler is preferably from 70 to 95% by mass of the epoxy resin molding material for sealing in order to decrease the flame retardancy, the moldability, the hygroscopicity and the linear expansion coefficient, and improve the strength. From the viewpoint of a decrease in the hygroscopicity and a decrease in the linear expansion coefficient, the amount is more preferably from 85 to 95% by mass thereof. If the blending amount of the inorganic filler is less than 70% by mass, the flame retardancy and the reflow resistance tend to lower. If the amount is more than 95% by mass, the fluidability tends to be short.

The inorganic filler (D) may be mixed with an alkoxysilane polymer (E) and/or a silane compound (F) in advance and then treated therewith by heating or the like.

(E) Alkoxysilane Polymer

The alkoxysilane polymer (E) used in the invention is a polymer obtained by using a single or two or more out of alkoxysilane compounds represented by a general formula (I) described below, and polymerizing one or more alkoxysilyl group moieties of the alkoxysilane compound(s).

When the alkoxysilane polymer (E) is a copolymer, examples thereof include random copolymer containing alkoxysilane compounds represented by the general formula (I) at random, alternating copolymer containing the compounds alternately, copolymer containing the polymers regularly, and block copolymer containing the polymers in the form of blocks. These copolymers may be used alone or in combination of two or more.

The molecular structure of the alkoxysilane polymer (E) may be linear or branched. These alkoxysilane polymers different in molecular structure may be used alone or in combination of two or more thereof.

[Chemical formula 22]

(I)

wherein $R^1$ represents any one of an —N=C=O group, a —SH group, an amino group, hydrocarbon groups which contain a heterocycle and may have a substituent, and bonded organic groups between which a divalent or trivalent heteroatom is interposed, the organic groups being allowable to have a substituent, $R^2$ represents a hydrocarbon group having 1 to 6 carbon atoms, $R^3$s each represent a methyl or ethyl group, $R^4$ represents a hydrogen atom or a methyl group, and m represents 2 or 3.

Specific examples of $R^1$ include a —N=C=O group; a —SH group; an amino group; hydrocarbon groups containing a heterocycle, such as a 3,4-epoxycyclohexyl group; and bonded organic groups between which a divalent or trivalent heteroatom is interposed, such as a methacrylate, acrylate, glycidyl ether, aniline, mono-substituted amino substituted with a aminoethyl group, or some other group. Any hydrogen atom of these groups may be substituted with a chlorine or bromine atom, an alkyl group such as a methyl or ethyl group, an amino group, a hydroxyl group, an organic group such as allyl group, aryl group or nitro group, or some other group. Preferred are epoxy, methacryloyloxy, acryloyloxy, amino, mercapto, and isocyanate groups, particularly, from the viewpoint of availability.

Specific examples of R²s include methyl, ethyl, propyl, butyl, isopropyl, isobutyl, tert-butyl, pentyl and hexyl groups. Of these groups, lower alkyl groups having 1 to 3 carbon atoms are preferred.

Specific examples of the compounds represented by the general formula (I) include γ-methacryloxypropyltrimethoxysilane, γ-methacryloxypropyltriethoxysilane, γ-methacryloxypropylmethyldimethoxysilane, γ-methacryloxypropylmethyldiethoxysilane, γ-acryloxypropyltrimethoxysilane, γ-acryloxypropyltriethoxysilane, β-(3,4-epoxycyclohexyl)ethyltrimethoxysilane, γ-glycycloxypropyltrimethoxysilane, γ-glycycloxypropyltriethoxysilane, γ-glycycloxypropylmethyldimethoxysilane, γ-glycycloxypropylmethyldiethoxysilane, γ-mercaptopropyltrimethoxysilane, γ-mercaptopropyltriethoxysilane, γ-aminopropyltrimethoxysilane, γ-aminopropyltriethoxysilane, N-β-(aminoethyl)-γ-aminopropyltriethoxysilane, isocyanatopropyltrimethoxysilane, isocyanatopropyltriethoxysilane, γ-anilinopropyltrimethoxysilane, γ-anilinopropyltriethoxysilane, and other silane-based compounds. These may be used alone or in combination of two or more thereof.

Of the alkoxysilane compounds represented by the general formula (I), preferred are γ-glycycloxypropyltrimethoxysilane, γ-glycycloxypropyltriethoxysilane, γ-glycycloxypropylmethyldimethoxysilane, γ-glycycloxypropylmethyldiethoxysilane, γ-methacryloxypropyltrimethoxysilane, γ-methacryloxypropyltriethoxysilane, γ-methacryloxypropylmethyldimethoxysilane, γ-methacryloxypropylmethyldiethoxysilane, and γ-acryloxypropyltrimethoxysilane from the viewpoint of the compatibility between fluidability and reflow resistance.

The alkoxysilane polymer (E), which is obtained by polymerizing the alkoxysilyl group moiety or moieties of one or more of the alkoxysilane compounds represented by the general formula (I), is a polymer having at least one of recurring units represented by general formulae (Ia), (Ib) and (Ic) illustrated below. Terminal structures of the alkoxysilane polymer (E) are each —OR³ or —R³.

[Chemical formula 23]

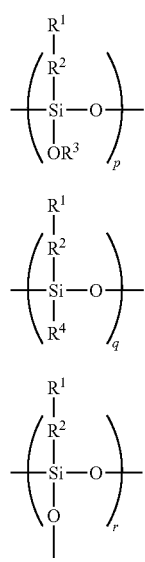

In the general formulae (Ia), (Ib) and (Ic), R¹s, R²s, R³s and R⁴s each represent the same as in the general formula (I), p, q and r each represent an integer of 0 to 10, and p+q+r represents an integer of 2 to 10.

The weight-average molecular weight (Mw) of the alkoxysilane polymer (E) is not particularly limited as far as the advantageous effects of the invention are attained. The weight-average molecular weight (Mw) is preferably 3000 or less, more preferably 2000 or less from the viewpoint of the handleability of the alkoxysilane polymer and the compatibility between the fluidability and curability of the epoxy resin molding material for sealing. The weight-average molecular weight (Mw) is determined by measurement using a calibration curve based on standard polystyrene according to gel permeation chromatography (GPC). In the invention, about the weight-average molecular weight (Mw), the following is referred to: a result obtained by using a pump (L-6200 model, manufactured by Hitachi Ltd.), columns (TSK gel-G5000HXL and TSK gel-G2000HXL, each of which is manufactured by Tosoh Corporation) and a detector (L-3300R¹ model, manufactured by Hitachi Ltd.) as a GPC to make a measurement using tetrahydrofuran as an eluent under conditions that the temperature is 30° C. and the flow rate is 1.0 mL/min.

The Mw/Mn of the alkoxysilane polymer (E) is preferably from 1.1 to 4.0, more preferably from 1.1 to 3.0 from the viewpoint of the compatibility between fluidability and curability.

When the alkoxysilane polymer (E) has epoxy groups, the epoxy equivalent is preferably from 200 to 600, more preferably from 200 to 500 from the viewpoint of the balance between fluidability, curability and adhesiveness.

The blending amount of the alkoxysilane polymer (E) is from 0.06 to 1.1% by mass of the total amount of the epoxy resin molding material for sealing from the viewpoint of the moldability and the adhesiveness of the epoxy resin molding material for sealing. If the blending amount of the alkoxysilane polymer (E) is less than 0.06% by mass, the fluidability of the epoxy resin molding material for sealing is insufficient so that the adhesiveness to various package members is deteriorated. If the blending amount of the alkoxysilane polymer (E) is more than 1.1% by mass, the fluidability of the epoxy resin molding material for sealing is improved but the reflow resistance is decreased largely and molding defects, such as voids, are generated. The blending amount of the alkoxysilane polymer (E) is preferably from 0.1 to 0.9% by mass, more preferably from 0.15 to 0.7% by mass.

The alkoxysilane polymer (E) may be used in the state that alkoxy groups in the alkoxysilane polymer (E) are hydrolyzed.

The method for producing the alkoxysilane polymer (E) used in the invention is not particularly limited as far as the method permits the advantageous effects of the invention to be attained. An example thereof is a method of hydrolyzing the alkoxy group of an alkoxysilane compound in the presence of an acidic catalyst and water, and subsequently subjecting the resultant to dehydrating condensation reaction, thereby yielding the alkoxysilane polymer. Examples of the acidic catalyst include organic acids such as oxalic acid and acetic acids, cation exchange resin, polytetrafluoroethylene/perfluorosulfonic acid copolymer, activated clay, zirconia sulfate, and zeolite. Of these acidic catalysts, cation exchange resin and activated clay are preferred from the viewpoint of storage stability and the control of the molecular weight of the alkoxysilane polymer. As far as the production of the alkoxysilane polymer is not hindered, a solvent may be used, examples thereof including methanol, ethanol, acetone, 2-butanone, tetrahydrofuran, and toluene. Conditions for the reaction are appropriately selected. Usually, the reaction temperature is from 20 to 150° C., and the reaction time is from 1 to 12 hours.

(F) Silane Compound

The epoxy resin molding material of the invention for sealing may contain a silane compound (F) different from the alkoxysilane polymer (E). The silane compound (F) is an organic silicon compound and is a monomer. Specific examples of the silane compound (F) include various silane-based compounds such as epoxysilane, mercaptosilane, aminosilane, alkylsilane, ureidosilane, and vinylsilane. The silane compound (F) may overlap with the alkoxysilane compound(s) that is/are the raw material(s) of the alkoxysilane polymer (E).

Examples thereof include silane compounds such as vinyltrichlorosilane, vinyltrimethoxysilane, vinyltriethoxysilane, vinyltris (β-methoxyethoxy)silane, γ-methacryloxypropyltrimethoxysilane, γ-methacryloxypropyltriethoxysilane, γ-methacryloxypropylmethyldimethoxysilane, γγ-methacryloxypropylmethyldiethoxysilane, γγ-methacryloxypropyldimethylmethoxysilane, γ-methacryloxypropyldimethylethoxysilane, γ-acryloxypropyltrimethoxysilane, γ-acryloxypropyltriethoxysilane, β-(3,4-epoxycyclohexyl) ethyltrimethoxysilane, γ-glycydoxypropyltrimethoxysilane, γ-glycydoxypropyltriethoxysilane, γ-glycydoxypropyldimethoxysilane, γ-glycydoxypropylmethyldiethoxysilane, γ-glycydoxypropyldimethylmethoxysilane, γ-glycydoxypropyldimethylethoxysilane, vinyltriacetoxysilane, rmercaptopropyltrimethoxysilane, γ-mercaptopropyltriethoxysilane, bis (triethoxysilylpropyl)tetrasulfide, γ-aminopropyltrimethoxysilane, γ-aminopropyltriethoxysilane, γ-[bis(β-hydroxyethyl]aminopropyltriethoxysilane, N-β-(aminoethyl)-γ-aminopropyltriethmsilane, N-(trimethoxysilylpropyl)ethylenediamine, isocyanatopropyltrimethoxysilane, isocyanatopropyltriethoxysilane, methyltrimethoxysilane, methyltriethoxysilane, dimethyldimethoxysilane, dimethyldiethoxysilane, phenyltrimethoxysilane, phenyltriethoxysilane, diphenyldimethoxysilane, diphenyldiethoxysilane, diphenylsilanediol, triphneylmethoxysilane, triphenylethoxysilane, triphenylsilanol, N-β-(N-vinylbenzylaminoethyl) -γ-raminopropyltrimethoxysilane, γ-chloropropyltrimethoxysilane, hexamethyldisilane, γ-anilinopropyltrimethoxysilane, γ-anilinopropyltriethoxysilane, 2-triethoxysilyl-N-(1, 3-dimethyl-butylidene) propylamine, 3-triethoxysilyl-N-(1,3-dimethyl-butylidene) propylamine, N-(3-triethoxysilylpropyl)phenylimine, 3-(3-(triethoxysilyl)propylamino)-N, N-dimethylpropionamide, N-triethoxysilylpropyl-β-alanine methyl ester, 3-(triethoxysilylpropyl)dihydro-3,5-furandione and bis(trimethoxysilyl)benzene; and imidazole-containing silane compounds, which are each a reaction product made from an imidazole compound such as 1 H-imidazole, 2-alkylimidazole, 2, 4-dialkylimidazole or 4-vinylimidazole, and y-glycydoxypropylalkoxysialne such as γ-glycydoxypropyltrimethoxysilane or γ-glycydoxypropyltriethoxysilane. These may be used alone or in combination of two or more thereof.

The blending amount of the silane compound (F) is preferably from 0.06 to 2% by mass of the total amount of the epoxy resin molding material for sealing, more preferably from 0.1 to 0.75% by mass thereof, particularly preferably from 0.2 to 0.7% by mass thereof from the viewpoint of moldability and adhesiveness. If the blending amount of the silane compound (F) is less than 0.06% by mass, the adhesiveness to various package members tends to be decreased. If the amount is more than 2% by mass, molding defects, such as voids, tend to be easily generated.

(Coupling Agent)

A coupling agent known in the prior art may be incorporated into the epoxy resin molding material of the invention for sealing. Examples of the coupling agent include titanate based coupling agents such as isopropyltriisostearoyl titanate, isopropyltris(dioctylpyrophophate) titanate, isopropyltri (N-aminoethyl-aminoethyl) titanate, tetraoctylbis(ditridecylphosphate) titanate, tetra(2,2-diallyloxymethyl-1-butyl) bis(ditridecyl)phosphate titanate, bis(dioctylpyrophosphate) oxyacetate titanate, bis(dioctylpyrophosphate) ethylenetitanate, isopropyltrioctanoyl titanate, isopropyldimethacrylisostearoyl titanate, isopropylisostearoyldiacryl titanate, isopropyltri(dioctylphosphate) titanate, isopropyltricumylphenyl titanate, tetraisopropylbis(dioctylphosphate) titanate; aluminum chelates; and aluminum/zirconium-based compounds. These may be used alone or in combination of two or more thereof. The blending amount of the coupling agent is preferably from 0.06 to 2% by mass of the total amount of the epoxy resin molding material for sealing, more preferably from 0.1 to 0.75% by mass thereof, particularly preferably from 0.2 to 0.7% by mass thereof from the viewpoint of moldability and adhesiveness. If the blending amount of the coupling agent is less than 0.06% by mass, the adhesiveness to various package members tends to be decreased. If the amount is more than 2% by mass, molding defects, such as voids, tend to be easily generated.

(Anion Exchange Body)

An anion exchange body may be optionally incorporated into the epoxy resin molding material of the invention for sealing in order to improve the moisture resistance and the high-temperature exposing property of ICs. The anion exchange body is not particularly limited, and may be one known in the prior art. Examples of the body include hydrotalcites, and hydrated oxides of an element selected from magnesium, aluminum, titanium, zirconium and bismuth. These may be used alone or in combination of two or more thereof. Of these examples, a hydrotalcite represented by the following composition formula (XXI) is preferred:

$$Mg_{1-x}Al_x(OH)_2(CO_3)_{x/2} \cdot mH_2O \qquad (XXI)$$

wherein $0<X\leq0.5$, and m represents a positive number.

The blending amount of the anion exchange body is not particularly limited as far as the amount is such a sufficient amount that anions such as halogen ions can be captured. The amount is preferably from 0.1 to 30 parts by mass, more preferably from 1 to 5 parts by mass with respect to 100 parts by mass of the epoxy resin (A).

(Adhesion Promoter)

An adhesion promoter may be optionally used in the epoxy resin molding material of the invention for sealing in order to improve the adhesiveness. Examples of the adhesion promoter include imidazole, triazole, tetrazole, triazine, and derivatives thereof; anthranilic acid, gallic acid, malonic acid, malic acid, maleic acid, aminophenol, quinoline, and derivatives thereof; aliphatic acid amide compounds; dithiocarbamic acid salts; and thiadiazole derivatives. These may be used alone or in combination of two or more thereof.

(Releasing Agent)

A releasing agent may be optionally used in the epoxy resin molding material of the invention for sealing. As the releasing agent, an oxidized or non-oxidized polyolefin-based wax is used preferably in an amount of 0.01 to 10 parts by mass, more preferably in that of 0.1 to 5 parts by mass with respect to 100 parts by mass of the epoxy resin (A). If the amount is less than 0.01 parts by mass, the releasing performance tends to be insufficient. If the amount is more than 10 parts by mass, the adhesiveness tends to be decreased. Examples of the oxidized or non-oxidized polyolefin-based wax include low molecular weight polyethylenes having a number-average molecular weight of about 500 to 10,000, such as H4, PE, and PED series (trade names) manufactured by Hoechst AG Examples of the releasing agent besides these agents include carnauba wax, montanoic acid esters, montanoic acid, and stearic acid. These may be used alone or in combination of two or more thereof. When the other releasing agent is used in addition to the oxidized or non-oxidized polyolefin-based wax, the blending amount of the releasing agents is as follow: the total amount of the combination is preferably from 0.1 to 10 parts by mass, more preferably from 0.5 to 3 parts by mass with respect to 100 parts by mass of the epoxy resin (A).

(Flame Retardant)

A flame retardant known in the prior art may be optionally incorporated into the epoxy resin molding material of the invention for sealing. Examples thereof include brominated epoxy resins; antimony trioxide; red phosphorus; red phosphorus covered with an inorganic substance such as aluminum hydroxide, magnesium hydroxide or zinc oxide and/or a thermosetting resin such as phenol resin; phosphorus compounds such as phosphates; nitrogen-containing compounds such as melamine, melamine derivatives, melamine-modified phenol resin, compounds having a triazine ring, cyanuric acid derivatives, and isocyanuric acid derivatives; phosphorus/nitrogen-containing compounds such as cyclophosphazene; aluminum hydroxide; magnesium hydroxide; and composite metal hydroxides represented by the following composition formula (XXII):

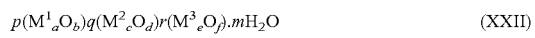

$$p(M^1_aO_b)q(M^2_cO_d)r(M^3_eO_f)\cdot mH_2O \tag{XXII}$$

wherein $M^1$, $M^2$ and $M^3$ represent metallic elements different from each other, a, b, c, d, p, q and m each represent a positive number, and r represents 0 or a positive number.

In the composition formula (XXII), $M^1$, $M^2$ and $M^3$ are not particularly limited as far as these are metallic elements different from each other. From the viewpoint of flame retardancy, it is preferred to select $M^1$ from metallic elements in the third period, alkaline earth elements in the group IIA, and metallic elements belonging to the groups IVB, IIB, VIII, IB, IIIA and IVA, and select $M^2$ from transition metal elements in groups from the group IIIB to the group IIB. It is more preferred to select $M^1$ from magnesium, calcium, aluminum, tin, titanium, iron, cobalt, nickel, copper and zinc, and select $M^2$ from iron, cobalt, nickel, copper and zinc. From the viewpoint of fluidability, preferred is a compound wherein $M^1$ is magnesium, $M^2$ is zinc or nickel, and r=0. The molar ratio between p, q and r is not particularly limited; it is preferred that r=0 and p/q is from 1/99 to 1/1. The classification of metallic elements is conducted on the basis of the long-period periodic table, wherein typical elements belong to the subgroup A and transition elements belong to the subgroup B (source: "Encyclopaedia Chemical 4", Compact Edition dated Feb. 15, 1987, 30th impression, published by Kyoritsu Shuppan Co., Ltd.).

Additional examples of the flame retardant include zinc oxide, zinc stannate, zinc borate, iron oxide, molybdenum oxide, zinc molybdate, dicyclopentadienyliron, and other metal-element-containing compounds. These may be used alone or in combination of two or more thereof.

The blending amount of the flame retardant is not particularly limited, and is preferably from 1 to 30 parts by mass, more preferably from 2 to 15 parts by mass with respect to 100 parts by mass of the epoxy resin (A).

A colorant may be used in the epoxy resin molding material of the invention for sealing, examples of the colorant including carbon black, organic dyes, organic pigments, titanium oxide, red lead, and Iron oxide red (red iron oxide). A stress-releasing agent such as silicone oil or silicone rubber powder may be optionally incorporated as some other additive.

The epoxy resin molding material of the invention for sealing may be prepared by any method as far as the method makes it possible to disperse and mix the individual components uniformly. An ordinary example of the method is a method of mixing the components in predetermined blending amounts sufficiently by means of a mixer or the like, melt-kneading the mixture through a mixing roll, an extruder or the like, and cooling and pulverizing the kneaded mixture. For example, the material can be obtained by a method of stirring and mixing predetermined amounts of the above-mentioned components uniformly, kneading the mixture by means of a kneader, a roll, an extruder or the like that is beforehand heated to 70 to 140° C., cooling the kneaded mixture, and subjecting the resultant to pulverizing and other treatments. In a case where the epoxy resin molding material for sealing is formed into the form of tablets having a dimension and a mass which match with conditions for molding a package, the material is easily handled.

(Electronic Component Device)

The electronic component device of the invention is characterized by being provided with an element sealed with the epoxy resin molding material of the invention for sealing. An example of this electronic component device is a product wherein active elements, such as a semiconductor chip, a transistor, a diode and a thyristor, and passive elements, such as a condenser, a resistor and a coil, are mounted on a supporting member, such as a lead frame, a wired tape carrier, a wiring board, a glass piece or a silicon wafer, and these element regions are sealed with the epoxy resin molding material of the invention for sealing. More specific examples thereof include an ordinary resin-sealed IC, such as a DIP (dual inline package), a PLCC (plastic leaded chip carrier), a QFP (quad flat package), an SOP (small outline package), an SOJ (small outline J-lead package), a TSOP (thin small outline package), or a TQFP (thin quad flat package) wherein semiconductor elements are fixed on a lead flame, terminal regions of the elements, such as bonding pads, are connected to a lead region through wire bonding or bumps, and then the resultant is sealed by transfer molding or the like by use of the epoxy resin molding material of the invention for sealing; a TCP (tape carrier package) wherein semiconductor chips connected to a tape carrier through bumps are sealed with the epoxy resin molding material of the invention for sealing; a COB (chip on board) module, a hybrid IC, or a multi-chip module wherein active elements, such as a semiconductor chip, a transistor, a diode and a thyristor, and/or passive elements, such as a condenser, a resistor and a coil, which are connected to a wiring board or wiring formed on a glass piece through wire bonding, flip-chip bonding, soldering or the like are sealed with the epoxy resin molding material of the invention for sealing; and a BGA (ball grid array) or a CSP (chip size package) wherein elements are mounted onto the front surface of an organic substrate wherein terminals for connection to a wiring board are formed on the rear surface, the elements are connected to wiring formed in the organic substrate through bumps or wire bonding, and then the elements are sealed with the epoxy resin molding material of the invention for sealing. The epoxy resin molding material of the invention for sealing can also be used effectively for a printed circuit board.

The method for sealing the epoxy resin molding material of the invention for sealing is most ordinarily low-pressure transfer molding. Injection molding, compression molding or the like may be used.

EXAMPLES

The invention will be described by way of the following examples; however, the scope of the invention is not limited by the examples.

In accordance with Synthesis Examples 1 to 5 described below, alkoxysilane polymers 1 to 5 were synthesized, and the weight-average molecular weight (Mw) and the molecular weight distribution (Mw/Mn) thereof were determined by gel permeation chromatography (GPC) using a calibration curve based on standard polystyrene. The measurements were made using a pump (L-6200 model, manufactured by Hitachi Ltd.), columns (TSK gel-G5000HXL and TSK gel-G2000HXL, each of which is manufactured by Tosoh Corporation) and a detector (L-3300RI model, manufactured by Hitachi Ltd.) as a GPC and using tetrahydrofuran as an eluent under conditions that the temperature was 30° C. and the flow rate was 1.0 mL/min. The epoxy equivalent was determined by potentiometric titration in compliance with JIS-K-7236.

Synthesis Example 1

Synthesis of Alkoxysilane Polymer 1

Into a 500-mL four-necked flask equipped with a stirrer, a thermometer and a reflux condenser tube were charged 118.2 g of γ-glycycloxypropyltrimethoxysilane, 11.8 g of methanol, 6.3 g of water, and 56 g of an ion exchange resin (trade name: UMBERLIST (transliteration) 15DRY, manufactured by Organo Corporation), and then the components were stirred at room temperature for 2 hours. A filter paper was used to filtrate the resultant solution under normal pressure to remove the ion exchange resin, and then the filtrate was heated to 50° C. under a reduced pressure (13 hPa) to remove the low boiling point components, thereby yielding an alkoxysilane polymer 1 (transparent and colorless liquid, yield=87%, Mw=530, Mw/Mn=1.68, epoxy equivalent=282).

Synthesis Example 2

Synthesis of Alkoxysilane Polymer 2

Into a 500-mL four-necked flask equipped with a stirrer, a thermometer and a reflux condenser tube were charged 104.8 g of γ-glycycloxypropyltrimethoxysilane, 17 g of methanol, 13.5 g of water, and 20 g of an activated clay (trade name: NIKKANITE (transliteration) G-36, manufactured by Nippon Activated Clay Co., Ltd.), and then the components were stirred at refluxing temperature for 6 hours. The resultant solution was filtrated under a reduced pressure to remove the activated clay, and then the filtrate was heated to 50° C. under a reduced pressure (13 hPa) to remove the low boiling point components, thereby yielding an alkoxysilane polymer 2 (transparent and colorless liquid, yield=75%, Mw=700, Mw/Mn=2.1, epoxy equivalent=264).

Synthesis Example 3

Synthesis of Alkoxysilane Polymer 3

Into a 500-mL four-necked flask equipped with a stirrer, a thermometer and a reflux condenser tube were charged 104.8 g of γ-glycycloxypropyltrimethoxysilane, 17 g of methanol, 13.5 g of water, and 20 g of an activated clay (trade name: NIKKANITE (transliteration) G-168, manufactured by Nippon Activated Clay Co., Ltd.), and then the components were stirred at refluxing temperature for 6 hours. The resultant solution was filtrated under a reduced pressure to remove the activated clay, and then the filtrate was heated to 50° C. under a reduced pressure (13 hPa) to remove the low boiling point components, thereby yielding an alkoxysilane polymer 3 (transparent and colorless liquid, yield=70%, Mw=1100, Mw/Mn=2.2, epoxy equivalent=262).

Synthesis Example 4

Synthesis of Alkoxysilane Polymer 4

Into a 500-mL four-necked flask equipped with a stirrer, a thermometer and a reflux condenser tube were charged 97.6 g of γ-glycycloxypropyltrimethoxysilane, 17 g of methanol, 13.5 g of water, and 20 g of an activated clay (trade name: NIKKANITE (transliteration) G-168, manufactured by Nippon Activated Clay Co., Ltd.), and then the components were stirred at refluxing temperature for 6 hours. The resultant solution was filtrated under a reduced pressure to remove the activated clay, and then the filtrate was heated to 50° C. under a reduced pressure (13 hPa) to remove the low boiling point components, thereby yielding an alkoxysilane polymer 4 (transparent and colorless liquid, yield=77%, Mw=1100, Mw/Mn=2.1, epoxy equivalent=265).

Synthesis Example 5

Synthesis of Alkoxysilane Polymer 5

Into a 500-mL four-necked flask equipped with a stirrer, a thermometer and a reflux condenser tube were charged 108.4 g of diphenyldimethoxysilane, 17 g of methanol, 13.5 g of water, and 20 g of an activated clay (trade name: NIKKANITE (transliteration) G-36, manufactured by Nippon Activated Clay Co., Ltd.), and then the components were stirred at refluxing temperature for 6 hours. The resultant solution was filtrated under a reduced pressure to remove the activated clay, and then the filtrate was heated to 50° C. under a reduced pressure (13 hPa) to remove the low boiling point components. The molecular weight of the product was then measured by GPC. As a result, no change was caused from the raw materials. Thus, no alkoxysilane polymer was yielded.

Examples 1 to 26 and Comparative Examples 1 to 17

Some of components described below were blended with each other in accordance with parts by mass shown in either one of Tables 1 to 5, and then roll-kneaded at a kneading temperature of 80° C. for a kneading time of 10 minutes to produce each of epoxy resin molding materials of Examples 1 to 26 and Comparative Examples 1 to 17 for sealing. Any blank in the tables means that the corresponding component were not blended.

As the individual components in the tables, the following were used.

(Epoxy Resins)

Epoxy resin 1: o-cresol Novolak type epoxy resin having an epoxy equivalent of 200 and a softening point of 67° C. (trade name: ESCN-190, manufactured by Sumitomo Chemical Co., Ltd.)

Epoxy resin 2: biphenyl type epoxy resin having an epoxy equivalent of 196 and a melting point of 106° C. (trade name: YX-4000H, manufactured by Japan Epoxy Resins Co., Ltd.)

Epoxy resin 3: biphenyl type epoxy resin having an epoxy equivalent of 176 and a melting point of 111° C. (trade name: YL-6121H, manufactured by Japan Epoxy Resins Co., Ltd.)

Epoxy resin 4: thiodiphenol type epoxy resin having an epoxy equivalent of 242 and a melting point of 118° C. (trade name: YSLV-120TE, manufactured by Nippon Steel Chemical Co., Ltd.)

Epoxy resin 5: naphthalene type epoxy resin having an epoxy equivalent of 217 and a softening point of 72° C. (trade name: NC-7300, manufactured by Nippon Kayaku Co., Ltd.)

Epoxy resin 6: triphenylmethane type epoxy resin having an epoxy equivalent of 170 and a softening point of 65° C. (trade name: EPPN-502H, manufactured by Nippon Kayaku Co., Ltd.)

Epoxy resin 7: bisphenol F type epoxy resin having an epoxy equivalent of 192 and a melting point of 79° C. (trade name: YSLV-80XY, manufactured by Nippon Steel Chemical Co., Ltd.)

Epoxy resin 8: biphenylene-skeleton-containing phenol/aralkyl type epoxy resin having an epoxy equivalent of 241 and a softening point of 96° C. (trade name: CER-3000L, manufactured by Nippon Kayaku Co., Ltd.)

Epoxy resin 9: β-naphthol/aralkyl type epoxy resin having an epoxy equivalent of 265 and a softening point of 66° C. (trade name: ESN-175S, manufactured by Nippon Steel Chemical Co., Ltd.)

Epoxy resin 10: bisphenol A type brominated epoxy resin having an epoxy equivalent of 375, a softening point of 80° C., and a bromine content of 48% by mass (Curing Agents)

Curing agent 1: phenol/aralkyl resin having a hydroxyl group equivalent of 199 and a softening point of 89° C. (trade name: MEH-7851, manufactured by Meiwa Plastic Industries, Ltd.)

Curing agent 2: phenol/aralkyl resin having a hydroxyl group equivalent of 176 and a softening point of 70° C. (trade name: MIREX (transliteration) XLC, manufactured by Mitsui Chemicals, Inc.)

Curing agent 3: naphthol/aralkyl resin having a hydroxyl group equivalent of 183 and a softening point of 79° C. (trade name: SN-170, manufactured by Nippon Steel Chemical Co., Ltd.)

Curing agent 4: triphenylmethane type phenol resin having a hydroxyl group equivalent of 104 and a softening point of 83° C. (trade name: MEH-7500, manufactured by Meiwa Plastic Industries, Ltd.)

Curing agent 5: Novolak type phenol resin having a hydroxyl group equivalent of 106 and a softening point of 64° C. (trade name: H-4, manufactured by Meiwa Plastic Industries, Ltd.)

Curing agent 6: copolymerization type phenol/aralkyl resin having a hydroxyl group equivalent of 156 and a softening point of 83° C. (trade name: HE-510, manufactured by Sumikin Air Water Chemical Inc.)

(Curing Accelerating Agents)

Curing accelerating agent 1: betaine type adduct of triphenylphosphine and p-benzoquinone Curing accelerating agent 2: betaine type adduct of tributylphosphine and p-benzoquinone (Inorganic Filler)

Fused silica: spherical fused silica having an average particle diameter of 17.5 μm, and a specific surface area of 3.8 $m^2/g$ (Silane Compounds)

Silane compound 1: γ-glycycloxypropyltrimethoxysilane
Silane compound 2: γ-aminopropyltriethoxysilane
Silane compound 3: diphenyldimethoxysilane (Alkoxysilane Polymers)

Alkoxysilane polymers 1 to 4: the alkoxysilane polymers 1 to 4 yielded in the Synthesis Examples were used.

The epoxy resin molding materials of Examples 1 to 26 and Comparative Examples 1 to 17 for sealing were evaluated in accordance with various characteristic tests (1) to (8) described below. The evaluation results are shown in Tables 1 to 5 described below. The epoxy resin molding materials for sealing were molded by means of a transfer molding machine under conditions that the mold temperature was 180° C., the molding pressure was 6.9 MPa and the curing time was 90 seconds unless otherwise specified. The materials were post-cured at 180° C. for 5 hours.

(1) Spiral Flow

A spiral flow measuring mold according to EMMI-1-66 was used to mold each of the epoxy resin molding materials for sealing under the above-mentioned conditions. The flow length (cm) thereof was determined.

(2) Disc Flow

A disc flow measuring flat mold was used which had an upper mold part 200 mm (W)×200 mm (D)×25 mm (H), and a lower mold part 200 mm (W)×200 mm (D)×15 mm (H). Five grams of each of the epoxy resin molding materials for sealing, which was weighed with an even balance, was put onto the center portion of the lower mold part heated to 180° C. After 5 seconds, the upper mold part heated to 150° C. was closed thereto, and the material was compression-molded under conditions that the load was 78 N and the curing time was 90 seconds. A slide caliper was used to measure the major axis (mm) and the minor axis (mm) of the molded body, and then the average value (mm) thereof was used as the disc flow value.

(3) Hot Hardness

Each of the epoxy resin molding materials for sealing was molded into a disc 50 mm in diameter×3 mm in thickness under the above-mentioned conditions. Just after the molding, a Shore D type harness meter (HD-1120 (type D) manufactured by Ueshima Seisakusho Co., Ltd.) was used to measure the hardness.

(4) Adhesion Retention Ratio

Each of the epoxy resin molding materials for sealing was molded onto a 30-μm aluminum foil piece and post-cured under the above-mentioned conditions to form a test piece. The test piece was subjected to PCT treatment (at 121° C. and 0.2 MPa for 100 hours). Before and after the treatment, the peel strength (N/m) of the test piece toward the 90-degree direction was measured. The adhesion retention ratio was evaluated in accordance with the following equation: adhesion retention (%)=aluminum peel strength after the PCT treatment/the aluminum peel strength before the PCT treatment×100.

(5) Solder Reflow Resistance

Each of the epoxy resin molding materials for sealing was used, and molded and post-cured under the above-mentioned conditions so as to form 80-pin flat packages each having an external shape 20×14×2 mm in dimension wherein a silicon chip, 8×10 mm, was mounted on a 42 alloy lead frame. The packages were humidified at 85° C. and 85% RH, and at intervals of a predetermined period the packages were subjected to reflow treatment at 240° C. for 10 seconds. It was then observed whether or not the packages were cracked. The number of cracked packages relative to the number (10) of tested ones of the packages was used to evaluate the solder reflow resistance.

(6) Water absorption

The disc molded in the item (3) post-cured under the above-mentioned conditions, and then allowed to stand still at 85° C. and 85% RH for 72 hours. A change in the mass before and after the standing was measured. The water absorption was evaluated in accordance with the following equation: water absorption (% by mass) ={(disc mass after the standing−disc mass before the standing)/disc mass before the standing} ×100

(7) Glass Transition Temperature (Tg)

Under the above-mentioned conditions, each of the epoxy resin molding materials for sealing was molded and post-cured to form a test piece with the dimensions of 19 mm×3 mm×3 mm. A thermomechanical analyzer (TMA-8140, TAS-100) manufactured by Rigaku Corp. was used to make a measurement at a temperature-raising rate of 5° C./min. The glass transition temperature (Tg, unit: ° C.) was determined from an inflection point of the linear expansion curve.

(8) Flame Retardancy

A mold for molding a test piece having a thickness of 1/16 inch (about 1.6 mm) was used to mold each of the epoxy resin molding materials for sealing and then post-cured under the above-mentioned conditions. The flame retardancy thereof was evaluated in accordance with the UL-94 test method.

TABLE 1

| | | | Examples | | | | | | | | |
|---|---|---|---|---|---|---|---|---|---|---|---|
| | | | 1 | 2 | 3 | 4 | 5 | 6 | 7 | 8 | 9 |
| Components (parts by mass) of epoxy resin molding material for sealing | Epoxy resin | 1 | 85.0 | | | | | | | | |
| | | 2 | | 85.0 | | | | | | | |
| | | 3 | | | 100.0 | | | | | | |
| | | 4 | | | | 85.0 | | | | | |
| | | 5 | | | | | 85.0 | | | | |
| | | 6 | | | | | | 100.0 | 42.5 | | |
| | | 7 | | | | | | | 42.5 | | |
| | | 8 | | | | | | | | 85.0 | |
| | | 9 | | | | | | | | | 100.0 |
| | | 10 | 15.0 | 15.0 | | 15.0 | 15.0 | | 15.0 | 15.0 | |
| | Curing agent | 1 | | | | | | | | | 103.6 |
| | | 2 | | 83.4 | 89.8 | | 68.9 | 72.7 | 72.4 | | |
| | | 3 | | | | | | | | | |
| | | 4 | | | | 54.4 | | | | 56.2 | |
| | | 5 | 49.3 | | | | | | | | |
| | | 6 | | | | | | | | | |
| | Alkoxysilane polymer | 1 | 7.5 | 7.5 | 7.5 | 7.5 | 7.5 | 7.5 | 7.5 | 7.5 | 7.5 |
| | | 2 | | | | | | | | | |
| | | 3 | | | | | | | | | |
| | | 4 | | | | | | | | | |
| | Silane compound | 1 | | | | | | | | | |
| | | 2 | | | | | | | | | |
| | | 3 | | | | | | | | | |
| | Curing accelerating agent 1 | | 2.8 | 3.5 | | 3.0 | 3.8 | 3.8 | 3.0 | 1.7 | 3.4 |
| | Curing accelerating agent 2 | | | | 4.5 | | | | | | |
| | Antimony trioxide | | 6.0 | 6.0 | | 6.0 | 6.0 | | 6.0 | 6.0 | |
| | Carnauba wax | | 2.0 | 2.0 | 2.0 | 2.0 | 2.0 | 2.0 | 2.0 | 2.0 | 2.0 |
| | Carbon black | | 1.5 | 1.5 | 1.5 | 1.5 | 1.5 | 1.5 | 1.5 | 1.5 | 1.5 |
| | Fused silica | | 1240 | 1495 | 1540 | 1279 | 1391 | 1406 | 1411 | 1282 | 1599 |
| Proportion (% by mass) of alkoxysilane polymer in total blending amount | | | 0.53 | 0.44 | 0.43 | 0.52 | 0.47 | 0.47 | 0.47 | 0.51 | 0.41 |
| Evaluation items | Spiral flow (cm) | | 89 | 121 | 94 | 106 | 119 | 92 | 103 | 93 | 115 |
| | Disc flow (mm) | | 80 | 94 | 88 | 101 | 97 | 90 | 90 | 82 | 95 |
| | Hot hardness | | 83 | 80 | 83 | 83 | 80 | 83 | 80 | 84 | 84 |
| | Adhesion retention ratio (%) | | 85 | 90 | 87 | 87 | 91 | 88 | 89 | 84 | 89 |
| | Solder reflow resistance | 24 h | 0/10 | 0/10 | 0/10 | 0/10 | 0/10 | 0/10 | 0/10 | 0/10 | 0/10 |
| | | 48 h | 0/10 | 0/10 | 0/10 | 0/10 | 0/10 | 0/10 | 0/10 | 0/10 | 0/10 |
| | | 72 h | 1/10 | 0/10 | 0/10 | 0/10 | 0/10 | 0/10 | 0/10 | 2/10 | 0/10 |
| | Water absorption (%) | | 0.16 | 0.15 | 0.14 | 0.15 | 0.15 | 0.14 | 0.14 | 0.17 | 0.14 |
| | Tg (° C.) | | 140 | 118 | 114 | 132 | 117 | 113 | 130 | 156 | 117 |
| | Flame retardancy | | V-0 | V-0 | V-0 | V-0 | V-0 | V-0 | V-0 | V-0 | V-0 |

TABLE 2

| | | | Examples | | | | | | | | |
|---|---|---|---|---|---|---|---|---|---|---|---|
| | | | 10 | 11 | 12 | 13 | 14 | 15 | 16 | 17 | 18 |
| Components (parts by mass) of epoxy resin molding material for sealing | Epoxy resin | 1 | | | | | | | | | |
| | | 2 | | | | | | | 100.0 | | |
| | | 3 | | | | | | | | | |
| | | 4 | | | | | | | | 100.0 | |
| | | 5 | | | | | | | | | |
| | | 6 | | | | | | | | | |
| | | 7 | 100.0 | 100.0 | | | | | | | 100.0 |
| | | 8 | | | 100.0 | 100.0 | 100.0 | | | | |

TABLE 2-continued

|  |  |  | Examples |  |  |  |  |  |  |  |  |
|---|---|---|---|---|---|---|---|---|---|---|---|
|  |  |  | 10 | 11 | 12 | 13 | 14 | 15 | 16 | 17 | 18 |
|  |  | 9 |  |  |  |  |  | 100.0 |  |  |  |
|  |  | 10 |  |  |  |  |  |  |  |  |  |
|  | Curing agent | 1 | 31.1 |  | 82.2 |  |  |  |  |  | 31.1 |
|  |  | 2 |  |  |  | 72.7 |  | 66.4 | 89.8 | 72.7 |  |
|  |  | 3 |  |  |  |  | 86.4 |  |  |  |  |
|  |  | 4 | 37.9 |  |  |  |  |  |  |  | 37.9 |
|  |  | 5 |  |  |  |  |  |  |  |  |  |
|  |  | 6 |  | 81.3 |  |  |  |  |  |  |  |
|  | Alkoxysilane | 1 | 7.5 | 7.5 | 7.5 | 7.5 | 7.5 | 7.5 |  |  |  |
|  | polymer | 2 |  |  |  |  |  |  | 7.5 | 7.5 | 7.5 |
|  |  | 3 |  |  |  |  |  |  |  |  |  |
|  |  | 4 |  |  |  |  |  |  |  |  |  |
|  | Silane | 1 |  |  |  |  |  |  |  |  |  |
|  | compound | 2 |  |  |  |  |  |  |  |  |  |
|  |  | 3 |  |  |  |  |  |  |  |  |  |
|  | Curing accelerating agent 1 |  |  |  |  | 3.0 | 3.0 | 2.8 |  | 3.8 |  |
|  | Curing accelerating agent 2 |  | 4.5 | 5.0 | 3.0 |  |  |  | 4.5 |  | 4.5 |
|  | Antimony trioxide |  |  |  |  |  |  |  |  |  |  |
|  | Carnauba wax |  | 2.0 | 2.0 | 2.0 | 2.0 | 2.0 | 2.0 | 2.0 | 2.0 | 2.0 |
|  | Carbon black |  | 1.5 | 1.5 | 1.5 | 1.5 | 1.5 | 1.5 | 1.5 | 1.5 | 1.5 |
|  | Fused silica |  | 1353 | 1447 | 1439 | 1369 | 1469 | 1322 | 1540 | 1406 | 1353 |
| Proportion (% by mass) of alkoxysilane polymer in total blending amount |  |  | 0.49 | 0.46 | 0.46 | 0.48 | 0.45 | 0.50 | 0.43 | 0.47 | 0.49 |
| Evaluation items | Spiral flow (cm) |  | 132 | 105 | 96 | 96 | 99 | 113 | 96 | 93 | 134 |
|  | Disc flow (mm) |  | 102 | 98 | 92 | 92 | 95 | 89 | 89 | 91 | 103 |
|  | Hot hardness |  | 84 | 83 | 83 | 84 | 83 | 81 | 83 | 83 | 84 |
|  | Adhesion retention ratio (%) |  | 87 | 88 | 88 | 89 | 89 | 88 | 86 | 87 | 86 |
|  | Solder | 24 h | 0/10 | 0/10 | 0/10 | 0/10 | 0/10 | 0/10 | 0/10 | 0/10 | 0/10 |
|  | reflow | 48 h | 0/10 | 0/10 | 0/10 | 0/10 | 0/10 | 0/10 | 0/10 | 0/10 | 0/10 |
|  | resistance | 72 h | 0/10 | 0/10 | 0/10 | 0/10 | 0/10 | 0/10 | 0/10 | 0/10 | 0/10 |
|  | Water absorption (%) |  | 0.14 | 0.15 | 0.14 | 0.14 | 0.14 | 0.14 | 0.14 | 0.14 | 0.14 |
|  | Tg (° C.) |  | 143 | 131 | 116 | 112 | 129 | 123 | 114 | 113 | 143 |
|  | Flame retardancy |  | V-0 | V-0 | V-0 | V-0 | V-0 | V-0 | V-0 | V-0 | V-0 |

TABLE 3

|  |  |  | Examples |  |  |  |  |  |  |  |
|---|---|---|---|---|---|---|---|---|---|---|
|  |  |  | 19 | 20 | 21 | 22 | 23 | 24 | 25 | 26 |
| Components (parts by mass) of epoxy resin molding material for sealing | Epoxy resin | 1 |  |  |  |  |  |  |  |  |
|  |  | 2 |  | 100.0 | 100.0 |  |  | 100.0 | 85.0 | 85.0 |
|  |  | 3 |  |  |  |  |  |  |  |  |
|  |  | 4 |  |  |  |  |  |  |  |  |
|  |  | 5 |  |  |  |  |  |  |  |  |
|  |  | 6 |  |  |  |  |  |  |  |  |
|  |  | 7 |  |  |  | 100.0 |  |  |  |  |
|  |  | 8 | 100.0 |  |  |  | 100.0 |  |  |  |
|  |  | 9 |  |  |  |  |  |  |  |  |
|  |  | 10 |  |  |  |  |  |  | 15.0 | 15.0 |
| | Curing agent | 1 |  |  |  | 31.1 |  |  |  |  |
|  |  | 2 | 72.7 | 89.8 | 89.8 |  | 72.7 | 89.8 | 83.4 | 83.4 |
|  |  | 3 |  |  |  |  |  |  |  |  |
|  |  | 4 |  |  |  | 37.9 |  |  |  |  |
|  |  | 5 |  |  |  |  |  |  |  |  |
|  |  | 6 |  |  |  |  |  |  |  |  |
|  | Alkoxysilane | 1 |  |  |  |  |  | 7.5 | 3.0 | 8.0 |
|  | polymer | 2 | 7.5 |  |  |  |  |  |  |  |
|  |  | 3 |  | 7.5 |  |  |  |  |  |  |
|  |  | 4 |  |  | 7.5 | 7.5 | 7.5 |  |  |  |
|  | Silane | 1 |  |  |  |  |  |  |  |  |
|  | compound | 2 |  |  |  |  |  |  |  |  |
|  |  | 3 |  |  |  |  |  | 5.0 |  |  |
|  | Curing accelerating agent 1 |  | 3.0 |  |  |  | 3.0 |  | 3.5 | 3.5 |
|  | Curing accelerating agent 2 |  |  | 4.5 | 4.5 | 4.5 |  | 4.5 |  |  |
|  | Antimony trioxide |  |  |  |  |  |  |  | 6.0 | 6.0 |

TABLE 3-continued

|  |  | Examples |  |  |  |  |  |  |  |
|---|---|---|---|---|---|---|---|---|---|
|  |  | 19 | 20 | 21 | 22 | 23 | 24 | 25 | 26 |
|  | Carnauba wax | 2.0 | 2.0 | 2.0 | 2.0 | 2.0 | 2.0 | 2.0 | 2.0 |
|  | Carbon black | 1.5 | 1.5 | 1.5 | 1.5 | 1.5 | 1.5 | 1.5 | 1.5 |
|  | Fused silica | 1369 | 1540 | 1540 | 1353 | 1369 | 1577 | 1462 | 1499 |
| Proportion (% by mass) of alkoxysilane polymer in total blending amount | | 0.48 | 0.43 | 0.43 | 0.49 | 0.48 | 0.42 | 0.18 | 0.47 |
| Evaluation items | Spiral flow (cm) | 97 | 95 | 96 | 135 | 98 | 96 | 82 | 123 |
|  | Disc flow (mm) | 93 | 90 | 91 | 104 | 94 | 91 | 73 | 96 |
|  | Hot hardness | 84 | 82 | 81 | 83 | 83 | 83 | 78 | 80 |
|  | Adhesion retention ratio (%) | 88 | 86 | 87 | 87 | 89 | 88 | 74 | 90 |
|  | Solder reflow resistance 24 h | 0/10 | 0/10 | 0/10 | 0/10 | 0/10 | 0/10 | 0/10 | 0/10 |
|  | 48 h | 0/10 | 0/10 | 0/10 | 0/10 | 0/10 | 0/10 | 0/10 | 0/10 |
|  | 72 h | 0/10 | 0/10 | 0/10 | 0/10 | 0/10 | 0/10 | 5/10 | 0/10 |
|  | Water absorption (%) | 0.14 | 0.14 | 0.14 | 0.14 | 0.14 | 0.13 | 0.16 | 0.15 |
|  | Tg (° C.) | 112 | 114 | 113 | 142 | 111 | 114 | 118 | 119 |
|  | Flame retardancy | V-0 | V-0 | V-0 | V-0 | V-0 | V-0 | V-0 | V-0 |

TABLE 4

|  |  |  | Comparative Examples |  |  |  |  |  |  |  |  |
|---|---|---|---|---|---|---|---|---|---|---|---|
|  |  |  | 1 | 2 | 3 | 4 | 5 | 6 | 7 | 8 | 9 |
| Components (parts by mass) of epoxy resin molding material for sealing | Epoxy resin | 1 | 85.0 |  |  |  |  |  |  |  |  |
|  |  | 2 |  | 85.0 | 100.0 |  |  |  |  |  |  |
|  |  | 3 |  |  |  | 85.0 |  |  |  |  |  |
|  |  | 4 |  |  |  |  | 85.0 | 100.0 | 42.5 |  |  |
|  |  | 5 |  |  |  |  |  |  | 42.5 |  |  |
|  |  | 6 |  |  |  |  |  |  |  | 85.0 |  |
|  |  | 7 |  |  |  |  |  |  |  |  | 100.0 |
|  |  | 8 |  |  |  |  |  |  |  |  |  |
|  |  | 9 |  |  |  |  |  |  |  |  |  |
|  |  | 10 | 15.0 | 15.0 |  | 15.0 | 15.0 |  | 15.0 | 15.0 |  |
|  | Curing agent | 1 |  |  |  |  |  |  |  |  | 103.6 |
|  |  | 2 |  | 83.4 | 89.8 |  | 68.9 | 72.7 | 72.4 |  |  |
|  |  | 3 |  |  |  |  |  |  |  |  |  |
|  |  | 4 |  |  |  | 54.4 |  |  |  | 56.2 |  |
|  |  | 5 | 49.3 |  |  |  |  |  |  |  |  |
|  |  | 6 |  |  |  |  |  |  |  |  |  |
|  | Alkoxysilane polymer | 1 |  |  |  |  |  |  |  |  |  |
|  |  | 2 |  |  |  |  |  |  |  |  |  |
|  |  | 3 |  |  |  |  |  |  |  |  |  |
|  |  | 4 |  |  |  |  |  |  |  |  |  |
|  | Silane compound | 1 | 7.5 |  |  |  |  |  |  | 7.5 |  |
|  |  | 2 |  | 7.5 | 7.5 | 7.5 | 7.5 | 7.5 | 7.5 |  | 7.5 |
|  |  | 3 |  |  |  |  |  |  |  |  |  |
|  | Curing accelerating agent 1 |  | 2.8 | 3.5 |  | 3.0 | 3.8 | 3.8 | 3.0 | 1.7 | 3.4 |
|  | Curing accelerating agent 2 |  |  |  | 4.5 |  |  |  |  |  |  |
|  | Antimony trioxide |  | 6.0 | 6.0 |  | 6.0 | 6.0 |  | 6.0 | 6.0 |  |
|  | Carnauba wax |  | 2.0 | 2.0 | 2.0 | 2.0 | 2.0 | 2.0 | 2.0 | 2.0 | 2.0 |
|  | Carbon black |  | 1.5 | 1.5 | 1.5 | 1.5 | 1.5 | 1.5 | 1.5 | 1.5 | 1.5 |
|  | Fused silica |  | 1240 | 1495 | 1540 | 1279 | 1391 | 1406 | 1411 | 1282 | 1599 |
| Proportion (% by mass) of alkoxysilane polymer in total blending amount |  |  | 0.00 | 0.00 | 0.00 | 0.00 | 0.00 | 0.00 | 0.00 | 0.00 | 0.00 |
| Evaluation items | Spiral flow (cm) |  | 72 | 65 | 55 | 61 | 65 | 55 | 59 | 78 | 60 |
|  | Disc flow (mm) |  | 63 | 62 | 53 | 58 | 62 | 53 | 56 | 67 | 57 |
|  | Hot hardness |  | 83 | 78 | 82 | 82 | 78 | 82 | 78 | 83 | 83 |
|  | Adhesion retention ratio (%) |  | 67 | 73 | 68 | 68 | 74 | 69 | 72 | 66 | 69 |
|  | Solder reflow resistance 24 h |  | 0/10 | 0/10 | 0/10 | 0/10 | 0/10 | 0/10 | 0/10 | 0/10 | 0/10 |
|  | 48 h |  | 6/10 | 1/10 | 1/10 | 4/10 | 1/10 | 1/10 | 2/10 | 2/10 | 1/10 |
|  | 72 h |  | 10/10 | 5/10 | 4/10 | 8/10 | 5/10 | 4/10 | 6/10 | 7/10 | 5/10 |
|  | Water absorption (%) |  | 0.17 | 0.15 | 0.15 | 0.15 | 0.15 | 0.15 | 0.14 | 0.17 | 0.14 |
|  | Tg (° C.) |  | 140 | 118 | 115 | 132 | 117 | 114 | 130 | 155 | 116 |
|  | Flame retardancy |  | V-0 | V-0 | V-0 | V-0 | V-0 | V-0 | V-0 | V-0 | V-0 |

TABLE 5

|  |  |  | Comparative Examples | | | | | | | |
|---|---|---|---|---|---|---|---|---|---|---|
|  |  |  | 10 | 11 | 12 | 13 | 14 | 15 | 16 | 17 |
| Components (parts by mass) of epoxy resin molding material for sealing | Epoxy resin | 1 |  |  |  |  |  |  |  |  |
|  |  | 2 |  |  |  |  |  |  | 85.0 | 85.0 |
|  |  | 3 |  |  |  |  |  |  |  |  |
|  |  | 4 |  |  |  |  |  |  |  |  |
|  |  | 5 |  |  |  |  |  |  |  |  |
|  |  | 6 |  |  |  |  |  |  |  |  |
|  |  | 7 | 100.0 | 100.0 |  |  |  |  |  |  |
|  |  | 8 |  |  | 100.0 | 100.0 | 100.0 |  |  |  |
|  |  | 9 |  |  |  |  |  | 100.0 |  |  |
|  |  | 10 |  |  |  |  |  |  | 15.0 | 15.0 |
|  | Curing agent | 1 | 31.1 |  | 82.2 |  |  |  |  |  |
|  |  | 2 |  |  |  | 72.7 |  | 66.4 | 83.4 | 83.4 |
|  |  | 3 |  |  |  |  | 86.4 |  |  |  |
|  |  | 4 | 37.9 |  |  |  |  |  |  |  |
|  |  | 5 |  |  |  |  |  |  |  |  |
|  |  | 6 |  | 81.3 |  |  |  |  |  |  |
|  | Alkoxysilane polymer | 1 |  |  |  |  |  |  | 0.8 | 20.0 |
|  |  | 2 |  |  |  |  |  |  |  |  |
|  |  | 3 |  |  |  |  |  |  |  |  |
|  |  | 4 |  |  |  |  |  |  |  |  |
|  | Silane compound | 1 |  |  |  |  |  |  |  |  |
|  |  | 2 | 7.5 | 7.5 | 7.5 | 7.5 | 7.5 | 7.5 |  |  |
|  |  | 3 |  |  |  |  |  |  |  |  |
|  | Curing accelerating agent 1 |  |  |  |  | 3.0 | 3.0 | 2.8 | 2.6 | 2.4 |
|  | Curing accelerating agent 2 |  | 4.5 | 5.0 | 3.0 |  |  |  |  |  |
|  | Antimony trioxide |  |  |  |  |  |  |  | 6.0 | 6.0 |
|  | Carnauba wax |  | 2.0 | 2.0 | 2.0 | 2.0 | 2.0 | 2.0 | 2.0 | 2.0 |
|  | Carbon black |  | 1.5 | 1.5 | 1.5 | 1.5 | 1.5 | 1.5 | 1.5 | 1.5 |
|  | Fused silica |  | 1353 | 1447 | 1439 | 1369 | 1469 | 1322 | 1395 | 1535 |
| Proportion (% by mass) of alkoxysilane polymer in total blending amount |  |  | 0.00 | 0.00 | 0.00 | 0.00 | 0.00 | 0.00 | 0.05 | 1.15 |
| Evaluation items | Spiral flow (cm) |  | 72 | 60 | 54 | 54 | 57 | 60 | 65 | 125 |
|  | Disc flow (mm) |  | 68 | 57 | 49 | 49 | 54 | 58 | 62 | 98 |
|  | Hot hardness |  | 81 | 83 | 82 | 84 | 83 | 79 | 78 | 77 |
|  | Adhesion retention ratio (%) |  | 70 | 68 | 68 | 69 | 69 | 68 | 60 | 75 |
|  | Solder reflow resistance | 24 h | 0/10 | 0/10 | 0/10 | 0/10 | 0/10 | 0/10 | 0/10 | 2/10 |
|  |  | 48 h | 1/10 | 1/10 | 1/10 | 1/10 | 1/10 | 1/10 | 1/10 | 6/10 |
|  |  | 72 h | 6/10 | 6/10 | 5/10 | 5/10 | 5/10 | 5/10 | 5/10 | 10/10 |
|  | Water absorption (%) |  | 0.15 | 0.15 | 0.14 | 0.14 | 0.14 | 0.15 | 0.18 | 0.17 |
|  | Tg (° C.) |  | 143 | 117 | 116 | 116 | 116 | 122 | 118 | 124 |
|  | Flame retardancy |  | V-0 | V-0 | V-0 | V-0 | V-0 | V-0 | V-0 | V-0 |

The following were found from Tables 1 to 5: In Examples 1 to 26, favorable properties are exhibited in the spiral flow, disc flow, adhesion retention ratio and solder reflow resistance than respective Comparative Examples having the same resin composition except that no alkoxysilane polymer is contained and a silane compound is contained. For example, Comparative Example 2 corresponds to Examples 2, 25 and 26, Comparative Example 3 corresponds to Examples 3, 16, 20, 21 and 24, and Comparative Example 10 corresponds to Examples 10, 18 and 22 in composition.

In Examples 1 to 26, which each contain 0.06 to 1.1% by mass of an alkoxysilane polymer, defects are substantially not generated in the reflow treatment after the humidification for 72 hours, and further no packages are cracked, either, in the reflow treatment after the humidification for 48 hours. Thus, these examples are excellent in solder reflow resistance. In particular, in the case of using the epoxy resin 2 (biphenyl type epoxy resin) as an epoxy resin in combination with the curing agent 2 (phenol/aralkyl resin) as a curing agent as shown in Example 2, and in the case of using the epoxy resin 7 (bisphenol F type epoxy resin) in combination with the curing agent 1 (phenol/aralkyl resin) and the curing agent 4 (triphenylmethane type phenol resin) as curing agents as shown in Example 10, 18 or 22, excellent fluidability is exhibited.

In the case of using the epoxy resin 1 (o-cresol Novolak type epoxy resin) as an epoxy resin in combination with the curing agent 5 (Novolak type phenol resin) as a curing agent as shown in Example 1, and in the case of using the curing agent 4 (triphenylmethane type phenol resin) as a curing agent as shown in Example 4, 8, 10, 18 or 22, a high Tg is exhibited. Of the Examples, Example 8 is particularly excellent in heat resistance, wherein both of the epoxy resin 6 (triphenylmethane type epoxy resin) and the epoxy resin 10 (bisphenol A type brominated epoxy resin) are used as epoxy resins.

On the other hand, Comparative Examples, which are different from the composition of the invention, do not satisfy the objects of the invention. Specifically, Comparative Examples 1 to 17 shown in Tables 4 and 5 are low in fluidability and adhesion retention ratio. In most of Comparative Examples, 50% or more of the packages are cracked in the reflow treatment after the humidification for 72 hours. Furthermore, package-cracks are generated also in the reflow treatment after the humidification for 48 hours. Thus, the Comparative Examples are poor in solder reflow resistance.

In Synthesis Example 5, wherein an alkoxysilane different from alkoxysilanes in the invention is used in alkoxysilane polymer synthesis, no alkoxysilane polymer is yielded.

The invention claimed is:

1. An epoxy resin molding material for sealing, comprising (A) an epoxy resin, (B) a curing agent, (C) a curing accelerating agent, (D) an inorganic filler, and (E) an alkoxysilane polymer, wherein the alkoxysilane polymer (E) is a polymer consisting of monomer units derived from at least one alkoxysilane reactant represented by the following general formula (I), wherein said alkoxysilane polymer (E) is obtained by polymerizing an alkoxysilyl group moiety of said at least one alkoxysilane reactant represented by the following general formula (I), and the blending amount of the alkoxysilane polymer (E) is from 0.06 to 1.1% by mass of the total amount of the epoxy resin molding material for sealing:

wherein $R^1$ represents an epoxy group, $R^2$ represents a hydrocarbon group having 1 to 6 carbon atoms, $R^3$s each represent a methyl or an ethyl group, $R^4$ represents a hydrogen atom or a methyl group, and m represents 2 or 3.

2. The epoxy resin molding material for sealing according to claim 1, wherein the weight-average molecular weight of the alkoxysilane polymer (E) is 3000 or less.

3. The epoxy resin molding material for sealing according to claim 2, wherein the epoxy resin (A) is at least not less than one epoxy resin selected from the group consisting of biphenyl type epoxy resin, thiodiphenol type epoxy resin, Novolak type epoxy resin, naphthalene type epoxy resin, triphenylmethane type epoxy resin, bisphenol F type epoxy resin, phenol/aralkyl type epoxy resin, and naphthol/aralkyl type epoxy resin.

4. The epoxy resin molding material for sealing according to claim 2, wherein the curing agent (B) contains at least not less than one curing agent selected from the group consisting of phenol/aralkyl resin, naphthol/aralkyl resin, triphenylmethane type phenol resin, Novolak type phenol resin, and copolymerization type phenol/aralkyl resin.

5. The epoxy resin molding material for sealing according to claim 2, which comprises (F) a silane compound different from the alkoxysilane polymer (E).

6. An electronic component device, provided with an element sealed with an epoxy resin molding material for sealing as recited in claim 2.

7. The epoxy resin molding material for sealing according to claim 1, wherein the epoxy resin (A) is at least not less than one epoxy resin selected from the group consisting of biphenyl type epoxy resin, thiodiphenol type epoxy resin, Novolak type epoxy resin, naphthalene type epoxy resin, triphenylmethane type epoxy resin, bisphenol F type epoxy resin, phenol/aralkyl type epoxy resin, and naphthol/aralkyl type epoxy resin.

8. The epoxy resin molding material for sealing according to claim 1, wherein the curing agent (B) contains at least not less than one curing agent selected from the group consisting of phenol/aralkyl resin, naphthol/aralkyl resin, triphenylmethane type phenol resin, Novolak type phenol resin, and copolymerization type phenol/aralkyl resin.

9. The epoxy resin molding material for sealing according to claim 1, which comprises (F) a silane compound different from the alkoxysilane polymer (E).

10. An electronic component device, provided with an element sealed with an epoxy resin molding material for sealing as recited in claim 1.

11. The epoxy resin molding material for sealing according to claim 1, wherein an epoxy equivalent of said alkoxysilane polymer (E) is from 200 to 600.

12. The epoxy resin molding material for sealing according to claim 11, wherein said epoxy equivalent is from 200 to 500.

13. The epoxy resin molding material for sealing according to claim 1, wherein said blending amount of the alkoxysilane polymer (E) is from 0.1 to 0.9% by mass.

14. The epoxy resin molding material for sealing according to claim 1, wherein said blending amount of the alkoxysilane polymer (E) is from 0.15 to 0.7% by mass.

* * * * *